United States Patent
Yamakawa et al.

(10) Patent No.: US 8,289,103 B2
(45) Date of Patent: Oct. 16, 2012

(54) FILTER DEVICE HAVING ATTENUATION POLES

(75) Inventors: Takehiko Yamakawa, Osaka (JP); Toshiyuki Okajima, Shiga (JP); Hiroshi Nakatsuka, Osaka (JP); Keiji Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 552 days.

(21) Appl. No.: 12/515,636

(22) PCT Filed: Nov. 19, 2007

(86) PCT No.: PCT/JP2007/072378
§ 371 (c)(1),
(2), (4) Date: Aug. 18, 2009

(87) PCT Pub. No.: WO2008/062753
PCT Pub. Date: May 29, 2008

(65) Prior Publication Data
US 2009/0315643 A1  Dec. 24, 2009

(30) Foreign Application Priority Data

Nov. 20, 2006  (JP) ................................. 2006-312591
Nov. 20, 2006  (JP) ................................. 2006-312593

(51) Int. Cl.
*H03H 7/00*  (2006.01)
(52) U.S. Cl. .......................... 333/174; 333/175; 333/185
(58) Field of Classification Search .................. 333/174, 333/175, 185
See application file for complete search history.

(56) References Cited

U.S. PATENT DOCUMENTS

| | | | |
|---|---|---|---|
| 5,227,748 A | 7/1993 | Sroka | |
| 5,392,011 A | 2/1995 | Li | |
| 6,115,605 A * | 9/2000 | Siccardo et al. | ........... 455/426.1 |
| 6,308,051 B1 | 10/2001 | Atokawa | |
| 6,483,399 B1 | 11/2002 | Atokawa | |
| 6,970,056 B2 | 11/2005 | Atokawa et al. | |
| 2002/0180558 A1 | 12/2002 | Atokawa et al. | |

FOREIGN PATENT DOCUMENTS

| | | |
|---|---|---|
| EP | 0 472 319 | 2/1992 |
| EP | 0 910 132 | 4/1999 |
| JP | 1238321 | 9/1989 |
| JP | 2-73821 | 6/1990 |
| JP | 2003-60408 | 2/2003 |
| JP | 2004/235898 | 8/2004 |

OTHER PUBLICATIONS

Supplementary European Search Report issued Jan. 8, 2010 in Application No. EP 07 83 2108.

(Continued)

*Primary Examiner* — Robert Pascal
*Assistant Examiner* — Kimberly Glenn
(74) *Attorney, Agent, or Firm* — Wenderoth, Lind & Ponack, L.L.P.

(57) ABSTRACT

A high frequency filter includes an inductor, a serial resonance circuit including an inductor and capacitors, a serial resonance circuit including an inductor and capacitors, and a varactor diode connected between a connection point between the capacitor and the capacitor and a connection point between the capacitor and the capacitor. A controller simultaneously changes two attenuation pole frequencies of the filter device by changing a capacitance of the varactor diode.

15 Claims, 28 Drawing Sheets

OTHER PUBLICATIONS

Zlatoljub D. Milosavliević et al., "A Class of Generalized Chebyshev Low-Pass Prototype Filter Design", Archiv Fur Elektronik Und Ubertragungstechnik, S. Hirzel Verlag. Stuttgart, DE, vol. 51, No. 6, Nov. 1, 1997 pp. 311-314.

European Office Action issued Dec. 16, 2010 in European Application No. 07 832 108.0.

International Search Report issued Feb. 26, 2008 in International (PCT) Application No. PCT/JP2007/072378, filed Nov. 19, 2007.

* cited by examiner

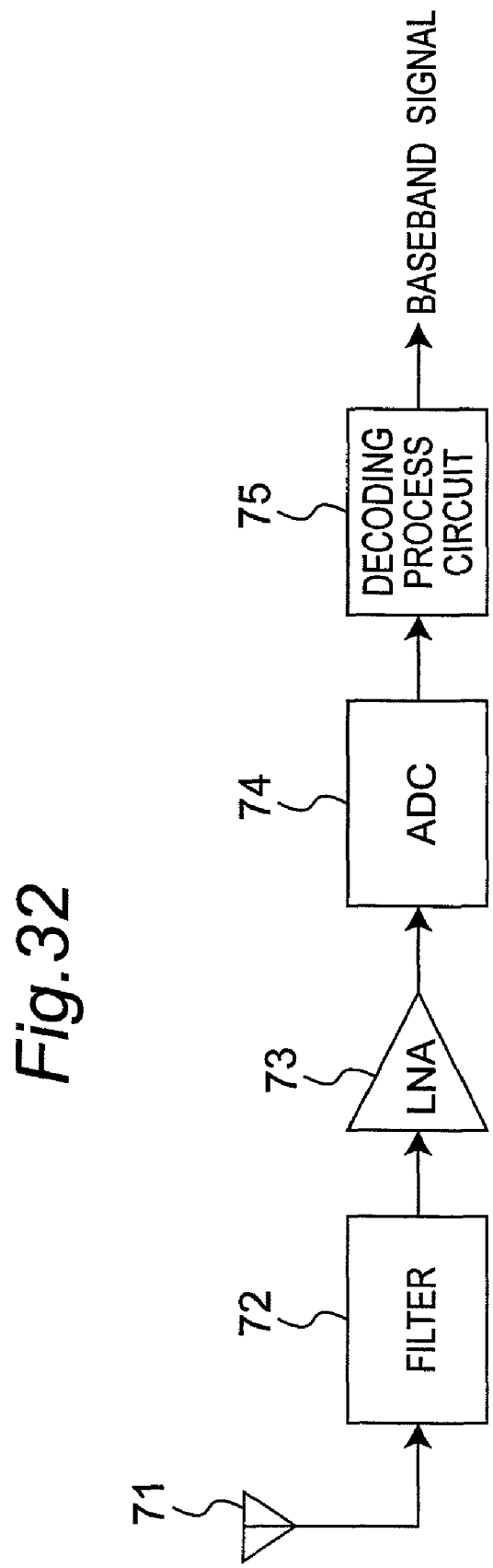

FILTER DEVICE HAVING ATTENUATION POLES

TECHNICAL FIELD

The present invention relates to a filter device, in particular, to a filter device having attenuation poles for use in a wireless communication circuit implemented in a mobile body such as a mobile telephone or a portable digital television broadcasting receiver, and a wireless communication device having the filter device.

BACKGROUND ART

In recent years, each of the components built in a portable electronic device such as a mobile telephone or a portable digital television broadcasting receiver is required to have a smaller size and a smaller power loss. For example, a filter device for use in a wireless communication circuit implemented in the above-mentioned electronic device is required to have a small size and a small insertion loss. As a filter device intended to meet these requirements, the following Patent Documents 1 and 2 each describe a high frequency filter having attenuation poles.

Patent Document 1: Japanese patent laid-open publication No. JP-1-238321-A.
Patent Document 2: Japanese patent laid-open publication No. JP-2003-60408-A.

DISCLOSURE OF THE INVENTION

Problems to be Solved by the Invention

For example, in a digital television broadcasting receiver, when an integer multiple frequency, in particular, an odd-number multiple frequency of a local frequency, which is a difference between a central frequency of a desired channel of a desired receiving wave of a digital television broadcasting and an intermediate frequency, overlaps with a frequency used in another system, it is required to greatly attenuate an interference wave that is a signal having the frequency used in another system. In this case, a required attenuation amount is determined based on a desired signal to undesired signal ratio (DU) which depends on a level of the interference wave and the performance of the wireless receiving integrated circuit of the digital television broadcasting receiver.

Currently, a Low-IF method, which enables omission of an intermediate frequency filter, is widely adopted in the digital television broadcasting receivers. The intermediate frequency is often set to several hundreds kHz. Accordingly, in a GHz band in which interference waves are required to be considered, the difference between the central frequency of the desired wave and the local frequency is relatively close to the intermediate frequency having several hundreds kHz.

In this case, assuming that the local frequency is approximately the same as the central frequency of the desired wave, exemplary frequencies at which signals are to be attenuated are calculated as follows. For example, when the desired channels are the channels 30 to 33 of the digital television broadcasting, the central frequencies of the respective desired waves are fallen within a frequency band of 575.14 MHz to 593.14 MHz, and a frequency band including frequencies three times the central frequencies of the desired waves overlaps with a frequency band of 1710 MHz to 1785 MHz corresponding to the uplink of the GSM (Global System for Mobile Communication) 1800 (Band-III). In addition, when the desired channels are the channels 35 to 38 of the digital television broadcasting, the central frequencies of the respective desired waves are fallen within a frequency band of 605.14 MHz to 623.14 MHz, and a frequency band including frequencies three times the central frequencies of the desired waves overlaps with a frequency band of 1805 MHz to 1880 MHz corresponding to the downlink of the GSM 1800 (Band-III). Further, when the desired channel is the channel 40 of the digital television broadcasting, then the central frequency of the desired wave is 635.14 MHz, and a frequency three times the central frequency of the desired wave is fallen within a frequency band of 1893 MHz to 1919 MHz of PHS (Personal Handyphone System) in Japan. When the desired channels are the channels 41 to 44 of the digital television broadcasting, the central frequencies of the respective desired waves are fallen within a frequency band of 641.14 MHz to 659.14 MHz, a frequency band including frequencies three times the central frequencies of the desired waves overlaps with a frequency band of 1920 MHz to 1980 MHz corresponding to the uplink of the UMTS (Universal Mobile Telephone Service) 2.0 GHz (Band-I). Namely, when the desired channels are the channels 30 to 41 of the digital television broadcasting at high frequencies, it is required to greatly attenuate signal components having frequencies fallen within a frequency band of 1.7 GHz to 2 GHz.

On the other hand, in a manner similar to the above-mentioned manner, exemplary frequencies at which signals are to be attenuated are calculated for lower desired channels as follows. When the desired channels are the channels 14 and 15 of the digital television broadcasting, the central frequencies of the desired waves are 479.14 MHz and 485.14 MHz, respectively, and a frequency band including frequencies three times the central frequencies of the desired waves overlaps with a frequency band of 1429 MHz to 1453 MHz corresponding to the uplinks of PDC (Personal Digital Cellular) 1.5 GHz and CDMA (Code Division Multiple Access) 1.5 GHz. In addition, when the desired channel is the channel 17 of the digital television broadcasting, the central frequency of the desired wave is 497.14 MHz, and a frequency three times the central frequency of the desired wave is fallen within a frequency band of 1477 MHz to 1501 MHz corresponding to the downlink of the PDC 1.5 GHz and the CDMA 1.5 GHz. Namely, when the desired channels are the channels 14, 15, and 17 of the digital television broadcasting at low frequencies, it is required to attenuate signal components having frequencies fallen within a frequency band of 1.4 GHz to 1.5 GHz.

As described above, the frequency at which signals are to be attenuated and the attenuation amounts of the signals change depending on the desired channels of the digital television broadcasting. However, the filter device having a plurality of attenuation poles according to the prior art had a plurality of variable capacitive elements for changing the attenuation pole frequencies of the attenuation poles according to the desired channels. Therefore, there is such a problem that the filter device has a relatively large size and required a high manufacturing cost.

In addition, generally speaking, in the filter device having a plurality of attenuation poles, one of the attenuation poles is arranged near a pass band thereof. Therefore, the filter device having the attenuation poles according to the prior art has the following problems. The attenuation pole closest to the pass band of the filter device leads to a power loss in the pass band, and the above-mentioned required attenuation amount cannot be obtained in a stop band of the filter device.

A first object of the present invention is to provide a filter device capable of solving the above-mentioned problems, having a smaller size and a lower manufacturing cost than that of the prior art, and capable of simultaneously changing a plurality of attenuation pole frequencies thereof.

Further, a second object of the present invention is to provide a filter device and a wireless communication device having the filter device each capable of solving the above-mentioned problems, and reducing the power loss in the pass band thereof and increasing the attenuation amount in the stop band thereof as compared with that of the prior art.

Means for Solving the Problems

According to the first aspect of the present invention, there is provided a filter device having a first terminal and a second terminal. The filter device has a reactance element connected between the first terminal and the second terminal, a first serial resonance circuit, a second serial resonance circuit, and a third capacitor. The first serial resonance circuit is connected between a connection point between the first terminal and one end of the reactance element, and a ground, and the first serial resonance circuit includes a first inductor and at least one first capacitor connected in series via respective connection points. The second serial resonance circuit is connected between a connection point between the second terminal and the other end of the reactance element, and the ground, and the second serial resonance circuit includes a second inductor and at least one second capacitor connected in series via respective connection points. The third capacitor is connected between one of the respective connection points of the first serial resonance circuit and one of the respective connection points of the second serial resonance circuit. One of the first, second, and third capacitors is a variable capacitive element. The variable capacitive element is connected to the first terminal via at least the first capacitor of the first serial resonance circuit, and is connected to the second terminal via at least the second capacitor of the second serial resonance circuit. The filter device has control means for controlling two attenuation pole frequencies of the filter device by changing a capacitance of the variable capacitive element.

In the above-mentioned filter device, the third capacitor is preferably the variable capacitive element, and one end of the variable capacitive element is preferably connected to the first terminal via at least the first capacitor of the first serial resonance circuit, and the other end of the variable capacitive element is connected to the second terminal via at least the second capacitor of the second serial resonance circuit.

In addition, in the above-mentioned filter device, the third capacitor is preferably the variable capacitive element, one end of the variable capacitive element is preferably connected to the first terminal via at least the first capacitor of the first serial resonance circuit, and is grounded via at least the first inductor of the first serial resonance circuit, and the other end of the variable capacitive element is preferably connected to the second terminal via at least the second capacitor of the second serial resonance circuit.

Further, in the above-mentioned filter device, the third capacitor is preferably a serial connection circuit including a fourth capacitor and the variable capacitive element connected in series, one end of the variable capacitive element is preferably connected to the first terminal via at least the first capacitor of the first serial resonance circuit, and is grounded via at least the first inductor of the first serial resonance circuit, and the other end of the variable capacitive element is preferably connected to the second terminal via the fourth capacitor and at least the second capacitor of the second serial resonance circuit.

Still further, in the above-mentioned filter device, the first serial resonance circuit preferably includes a plurality of first capacitors, the plurality of first capacitors preferably includes the variable capacitive element, one end of the variable capacitive element is preferably grounded, and the other end of the variable capacitive element is preferably connected to the first terminal via at least the first capacitor of the first serial resonance circuit, and is connected to the second terminal via the third capacitor and at least the second capacitor of the second serial resonance circuit.

In addition, in the above-mentioned filter device, the other end of the variable capacitive element is preferably further grounded via at least the second inductor of the second serial resonance circuit.

According to the second aspect of the present invention, there is provided a filter device having a first terminal and a second terminal. The filter device has a reactance element, a first serial resonance circuit, a second serial resonance circuit, a variable capacitor element, and control means. The reactance element is connected between the first terminal and the second terminal. The first serial resonance circuit is connected between a connection point between the first terminal and one end of the reactance element, and a ground, and the first serial resonance circuit includes a first inductor and a first capacitor. The second serial resonance circuit is connected between a connection point between the second terminal and the other end of the reactance element, and the ground, and the second serial resonance circuit includes a second inductor and a second capacitor. The variable capacitor element is connected between a connection point between the first serial resonance circuit and the second serial resonance circuit, and the ground. The control means controls two attenuation pole frequencies of the filter device by changing a capacitance of the variable capacitive element.

According to the third aspect of the present invention, there is provided a filter device having a first terminal and a second terminal, and the filter device has a predetermined pass band. The filter device has a reactance element, a first serial resonance circuit, and a second serial resonance circuit. The reactance element is connected between the first terminal and the second terminal. The first serial resonance circuit is connected between a connection point between the first terminal and one end of the reactance element, and a ground, the first serial resonance circuit includes a first capacitor having a first capacitance and a first inductor having a first inductance, and the first serial resonance circuit has a first resonance frequency determined based on a product of the first capacitance and the first inductance. The second serial resonance circuit is connected between a connection point between the second terminal and the other end of the reactance element, and the ground, the second serial resonance circuit includes a second capacitor having a second capacitance and a second inductor having a second inductance, and the second serial resonance circuit has a second resonance frequency determined based on a product of the second capacitance and the second inductance. The first and second resonance frequencies are set so that the first resonance frequency is closer to the pass band than the second resonance frequency, and so that a value obtained by dividing the first inductance by the first capacitance is larger than a value obtained by dividing the second inductance by the second capacitance.

In the above-mentioned filter device, at least one of the first capacitor and the second capacitor is preferably a serial connection circuit including a third capacitor and a variable capacitive element connected in series.

According to the fourth aspect of the present invention, there is provided a wireless communication device having the above-mentioned filter device for filtering a wireless received signal received by an antenna, amplification means for amplifying and outputting the wireless received signal from the filter device, and decoding means for decoding a signal from the amplification means into a baseband signal, and outputting the baseband signal.

Effects of the Invention

According to each of the filter devices according to the first and second aspects of the present invention and the wireless communication device having the filter device, the two attenuation pole frequencies of the filter device are changed by changing the capacitance of the one variable capacitive element. Therefore, the filter device has a smaller size and a lower manufacturing cost, than that of the filter device having the plurality of variable capacitive elements according to the prior art.

In addition, according to the filter device according to the third aspect of the present invention and the wireless communication device having the filter device, one of a first attenuation pole frequency and a second attenuation pole frequency closer to the pass band of the filter device is set to the first resonance frequency, and the other attenuation pole frequency is set to the second resonance frequency. In addition, the value obtained by dividing the first inductance by the first capacitance is larger than the value obtained by dividing the second inductance by the second capacitance. Therefore, as compared with the prior art, power loss in the pass band is smaller and the attenuation amount is larger in the stop band.

BRIEF DESCRIPTION OF THE DRAWINGS

FIG. 32 is a block diagram showing a configuration of a wireless communication device according to a thirteenth embodiment of the present invention.

DESCRIPTION OF REFERENCE SYMBOLS

Figure 1:
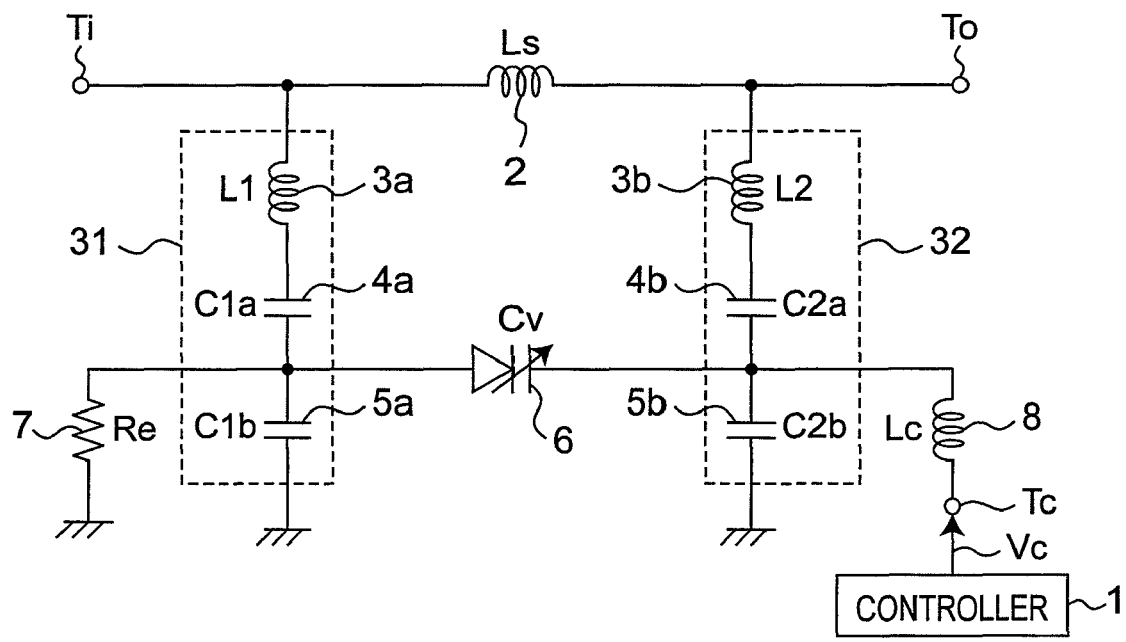
FIG. 1 is a circuit diagram of a variable-frequency high frequency filter according to a first embodiment of the present invention.

1 . . . Controller,
2, 2a, 2b, 2c, 2-n, 3a, 3b, 3c, 3d, 3-n . . . Inductor,
4a, 4b, 4c, 4d, 4-n, 5a, 5b, 5c, 5d, 9, 9a, 9b, 10a, 10b, 11a, 11b, 11c, 60, 60a, 61a, 61b, 62a, 62b . . . Capacitor,
6, 6a, 6b, 6c, 6d . . . Varactor diode,
7, 7a . . . Resistor,
8, 8a, 8b, 8c 8d . . . Choke coil, 31, 31a, 31b, 31c, 31d, 31f, 31g, 31-n, 32, 32a, 32b, 32c, 32d, 32e, 32f, 32g, 33, 33g, 33f, 34g . . . Serial resonance circuit,
61 . . . Serial connection circuit,
63 to 69 . . . Reactance element,
72 . . . Filter,
73 . . . Low-noise amplifier,
74 . . . Analog-to-digital converter,
75 . . . Decoding process circuit,
Tc, Tc1, Tc2, Tc3, Tc4 . . . Control terminal,
Ti . . . Input terminal, and
To . . . Output terminal.

BEST MODE FOR CARRYING OUT THE INVENTION

Embodiments according to the present invention will be described below with reference to the attached drawings. Components similar to each other are denoted by the same reference numerals.

Each of high frequency filters according to a first to twelfth embodiments described below is implemented in a digital television broadcasting receiver for receiving digital television broadcasting signals having frequencies fallen within a frequency band of 470 MHz to 770 MHz.

First Embodiment

FIG. 1 is a circuit diagram of a variable-frequency high frequency filter according to a first embodiment of the present invention. Referring to FIG. 1, the high frequency filter according to the first embodiment is constituted by including a controller 1, an inductor 2 connected between an input terminal Ti and an output terminal To, a serial resonance circuit 31 connected between a connection point between the input terminal Ti and one end of the inductor 2 and a ground, a serial resonance circuit 32 connected between a connection point between the output terminal To and the other end of the inductor 2 and the ground, a varactor diode 6 of a variable capacitive element, a resistor 7, and a choke coil 8. In this case, the serial resonance circuit 31 is a circuit in which an inductor 3a, a capacitor 4a, and a capacitor 5a are connected in series in this order. One end of the inductor 3a is connected to the connection point between the input terminal Ti and one end of the inductor 2, and one end of the capacitor 5a is grounded. Further, the serial resonance circuit 32 is a circuit in which an inductor 3b, a capacitor 4b, and a capacitor 5b are connected in series in this order. One end of the inductor 3b is connected to the connection point between the output terminal To and the other end of the inductor 2, and one end of the capacitor 5b is grounded. Further, an anode of the varactor diode 6 is grounded via a connection point between the capacitors 4a and 5a and the resistor 7, and a cathode of the varactor diode 6 is connected to a control terminal Tc via a connection point between the capacitors 4b and 5b and a high frequency blocking choke coil 8.

Referring to FIG. 1, the controller 1 changes a reverse bias voltage applied to the varactor diode 6 by changing a direct-current (DC) voltage Vc applied to the control terminal Tc via the high frequency blocking choke coil 8. Thus, the controller 1 simultaneously changes two attenuation pole frequencies of the high frequency filter 2 shown in FIG. 1 by changing a capacitance Cv of the varactor diode 6. Concretely speaking, the controller 1 increases the DC voltage Vc to increase the reverse bias voltage applied to the varactor diode 6 so that the capacitance Cv of the varactor diode 6 is reduced. It is to be noted that the capacitor 4a is a low frequency blocking capacitor provided to prevent a DC component of the DC voltage Vc from leaking to the input terminal Ti, and that the capacitor 4b is a low frequency blocking capacitor provided to prevent the DC component of the DC voltage Vc from leaking to the output terminal To. In addition, the resistor 7 is provided to ground the anode of the varactor diode 6 in a DC fashion.

Referring to FIGS. 2 to 8, the operation performed by the high frequency filter shown in FIG. 1 will be described below.

Figure 3:
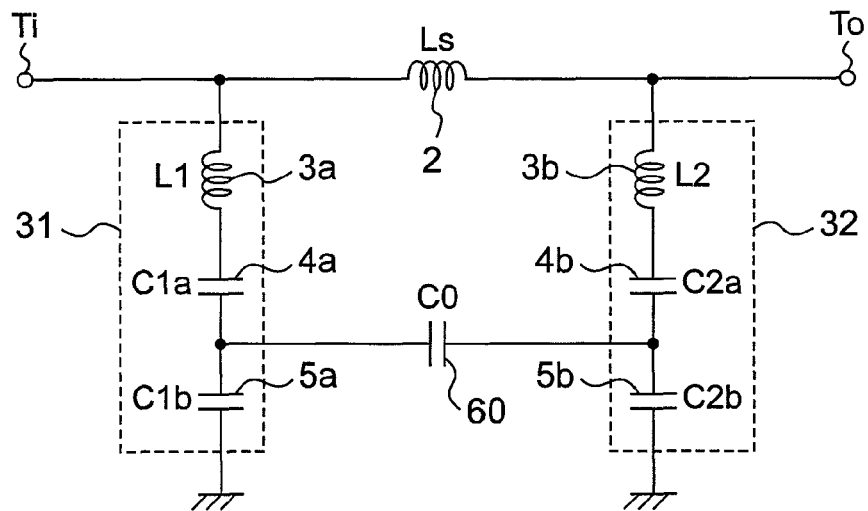
FIG. 3 is a circuit diagram showing a circuit equivalent to the high frequency filter shown in FIG. 1.

FIG. 3 is a circuit diagram showing a circuit equivalent to the high frequency filter shown in FIG. 1. The circuit shown in FIG. 3 is equivalent to that shown in FIG. 1 in a high frequency band of the digital television broadcasting signals. The high frequency filter shown in FIG. 3 is constituted by including the inductor 2 connected between the input terminal Ti and the output terminal To, the serial resonance circuit 31 connected between the connection point between the input terminal Ti and one end of the inductor 2 and the ground, the serial resonance circuit 32 connected between the connection point between the output terminal To and the other end of the inductor 2 and the ground, and a capacitor 60. In this case, the capacitor 60 is connected between the connection point between the capacitors 4a and 5a, and the connection point between the capacitors 4b and 5b.

Figure 4:
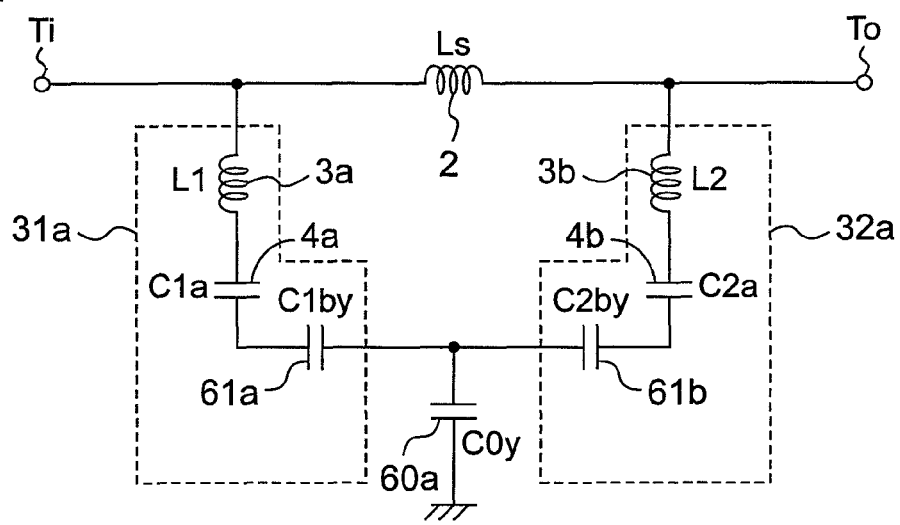
FIG. 4 is a circuit diagram showing a circuit equivalent to the high frequency filter shown in FIG. 3.

Next, by equivalently converting the circuit configured by connecting the capacitors 5a, 60, and 5b in a form of π into a circuit configured by connecting capacitors 61a, 61b, and 60a in a form of Y, a circuit equivalent to the circuit shown in FIG. 3 is obtained as shown in FIG. 4. The high frequency filter shown in FIG. 4 is constituted by including the inductor 2 connected between the input terminal Ti and the output terminal To, a serial resonance circuit 31a connected between the connection point between the input terminal Ti and one end of the inductor 2 and the ground, a serial resonance circuit 32a connected between the connection point between the output terminal To and the other end of the inductor 2, and the ground, and the capacitor 60a connected between a connection point between the serial resonance circuits 31a and 32a and the ground. In this case, the serial resonance circuit 31a is a circuit in which the inductor 3a, the capacitor 4a, and the capacitor 61a are connected in series in this order. One end of the inductor 3a is connected between the connection point between the input terminal Ti and one end of the inductor 2. One end of the capacitor 61a is connected to one end of the capacitor 60a. Further, the serial resonance circuit 32a is a circuit in which the inductor 3b, the capacitor 4b, and the capacitor 61b are connected in series in this order. One end of the inductor 3b is connected between the connection point between the output terminal To and the other end of the inductor 2. One end of the capacitor 61b is connected to one end of the capacitor 60a.

Referring to FIG. 4, a capacitance C0y of the capacitor 60a, a capacitance C1by of the capacitor 61a, and a capacitance C2by of the capacitor 61b are represented by the following equations, respectively, using a capacitance C1a of the capacitor 4a, a capacitance C2a of the capacitor 4b, and a capacitance C0 of the capacitor 60.

[Equation 1]

$$C0y = \frac{C0 \times C1b + C1b \times C2b + C2b \times C0}{C0} \quad (1)$$

[Equation 2]

$$C1by = \frac{C0 \times C1b + C1b \times C2b + C2b \times C0}{C2b} \quad (2)$$

-continued

[Equation 3]
$$C2by = \frac{C0 \times C1b + C1b \times C2b + C2b \times C0}{C1b} \quad (3)$$

Figure 5:
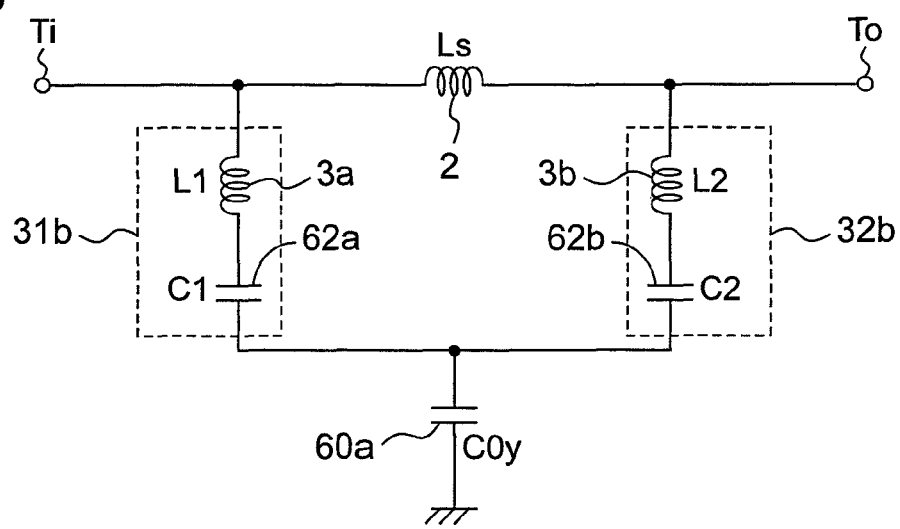
FIG. 5 is a circuit diagram showing a circuit equivalent to the high frequency filter shown in FIG. 4.

Further, in FIG. 4, the capacitors 4a and 61a connected in series are replaced by one capacitor 62a, and the capacitors 4b and 61b connected in series are replaced by one capacitor 62b, so as to obtain a circuit equivalent to that shown in FIG. 4 as shown in FIG. 5. A capacitance C1 of the capacitor 62a and a capacitance C2 of the capacitor 62b are represented by the following equations, respectively.

[Equation 4]
$$C1 = \frac{C1a \times C1by}{C1a + C1by} \quad (4)$$

[Equation 5]
$$C2 = \frac{C2a \times C2by}{C2a + C2by} \quad (5)$$

In this case, the high frequency circuit shown in FIG. 5 is constituted by including the inductor 2 connected between the input terminal Ti and the output terminal To, a serial resonance circuit 31b connected between the connection point between the input terminal Ti and one end of the inductor 2 and the ground, a serial resonance circuit 32b connected between the connection point between the output terminal To and the other end of the inductor 2 and the ground, and the capacitor 60a connected between a connection point between the serial resonance circuits 31b and 32b and the ground. In this case, the serial resonance circuit 31b includes the inductor 3a and the capacitor 62a, one end of the inductor 3a is connected to the connection point between the input terminal Ti and one end of the inductor 2, and one end of the capacitor 62a is connected to one end of the capacitor 60a. Further, the serial resonance circuit 32b includes the inductor 3b and the capacitor 62b, one end of the inductor 3b is connected to the connection point between the output terminal To and the other end of the inductor 2, and one end of the capacitor 62b is connected to one end of the capacitor 60a.

Figure 6:
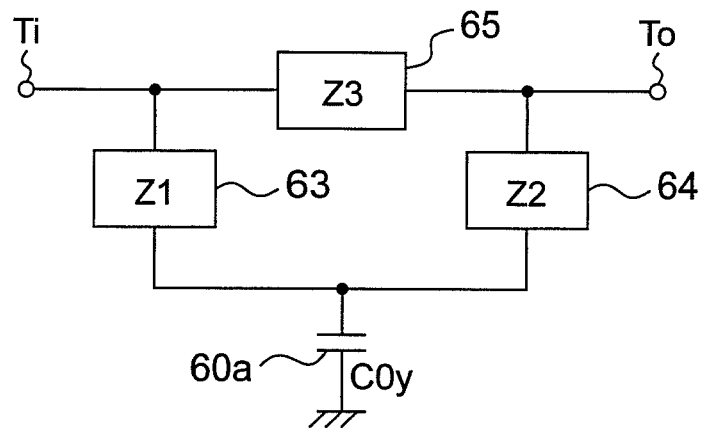
FIG. 6 is a circuit diagram showing a circuit equivalent to the high frequency filter shown in FIG. 5.

In addition, FIG. 6 is a circuit diagram expressing the circuit shown in FIG. 5 using a reactance element 63 having an impedance Z1 of the serial resonance circuit 31b, a reactance element 64 having an impedance Z2 of the serial resonance circuit 32b, and a reactance element 65 having an impedance Z3 of the inductor 2. In this case, the impedances Z1, Z2, and Z3 are represented by the following equations, respectively, using an inductance Ls of the inductor 2, an inductance L1 of the inductor 3a, the capacitance C1 of the capacitor 62a, an inductance L2 of the inductor 3b, the capacitance C2 of the capacitor 62b, the capacitance C0y of the capacitor 60a, an angular frequency ω, and an imaginary unit j.

[Equation 6]
$$Z1 = j\left(\omega \times L1 - \frac{1}{\omega \times C1}\right) \quad (6)$$

[Equation 7]
$$Z2 = j\left(\omega \times L2 - \frac{1}{\omega \times C2}\right) \quad (7)$$

[Equation 8]
$$Z3 = j \times \omega \times Ls \quad (8)$$

Figure 7:
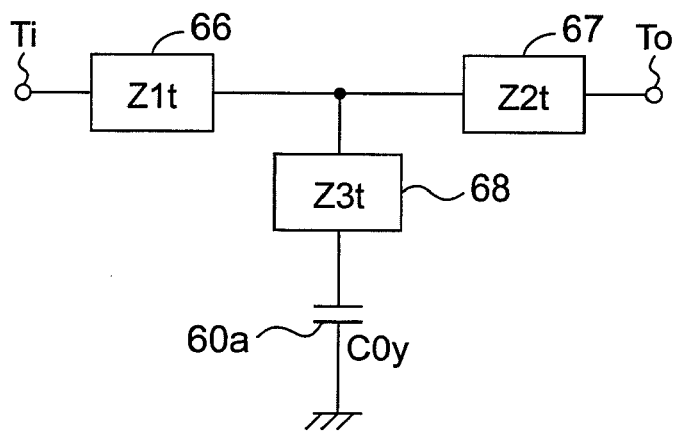
FIG. 7 is a circuit diagram showing a circuit equivalent to the high frequency filter shown in FIG. 6.

Further, the circuit configured by connecting the reactance elements 63, 64, and 65 in a form of π in FIG. 6 is equivalently converted into a circuit configured by connecting reactance elements 66, 67, and 68 having impedances Z1t, Z2t, and Z3t, respectively, in a form of Y, so as to obtain a circuit equivalent to that shown in FIG. 6 as shown in FIG. 7. Referring to FIG. 7, the reactance elements 66 and 67 are connected in series between the input terminal Ti and the output terminal To. In addition, the reactance element 68 is connected between a connection point between the reactance elements 66 and 67 and the capacitor 60a. In this case, the impedances Z1t, Z2t, and Z3t are represented by the following equations, respectively.

[Equation 9]
$$Z1t = \frac{Z1 \times Z3}{Z1 + Z2 + Z3} \quad (9)$$

[Equation 10]
$$Z2t = \frac{Z2 \times Z3}{Z1 + Z2 + Z3} \quad (10)$$

[Equation 11]
$$Z3t = \frac{Z1 \times Z2}{Z1 + Z2 + Z3} \quad (11)$$

Figure 8:
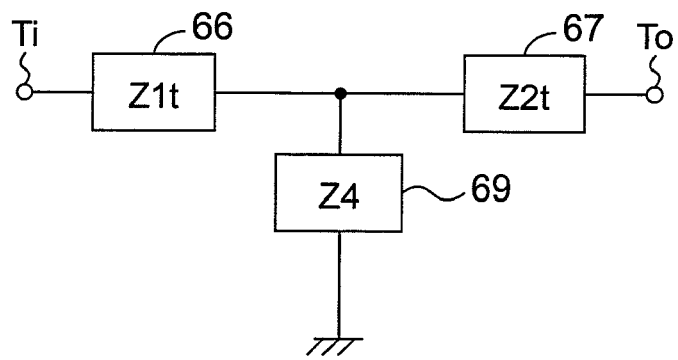
FIG. 8 is a circuit diagram showing a circuit equivalent to the high frequency filter shown in FIG. 7.

Further, the circuit configured by connecting the reactance element 68 to the capacitor 60a in series in FIG. 7 is equivalently converted into one reactance element 69, so as to obtain a circuit equivalent to that shown in FIG. 7 as shown in FIG. 8. In this case, an impedance Z4 of the reactance element 69 is represented by the following equation.

[Equation 12]
$$Z4 = Z3t + \frac{1}{j \times \omega \times C0y} \quad (12)$$

In the circuit of FIG. 8, when the impedance Z4 is equal to zero, two attenuation poles P1 and P2 are formed. Accordingly, attenuation pole frequencies fp1 and fp2 (fp1<fp2) of the two attenuation poles P1 and P2 are represented by the following equations, respectively, using the inductances L1, L2, and Ls and the capacitances C1, C2, and C0y of the components shown in FIG. 5.

[Equation 13]
$$fp1 = \frac{1}{2\pi\sqrt{A+B}} \quad (13)$$

-continued

[Equation 14]
$$fp2 = \frac{1}{2\pi\sqrt{A-B}} \quad (14)$$

In this case, the constants A and B are represented by the following equations, respectively.

[Equation 15]
$$A = \frac{D}{2 \times C0y \times C1 \times C2 \times L1 \times L2} \quad (15)$$

[Equation 16]
$$B = \frac{\sqrt{D^2 - 4 \times C0y \times C1 \times C2 \times L1 \times L2 \times (C0y + C1 + C2)}}{2 \times C0y \times C1 \times C2 \times L1 \times L2} \quad (16)$$

In this case, the constant D is represented by the following equation.

[Equation 17]
$$D = (C0y+C2) \times C1 \times L1 + (C0y+C1) \times C2 \times L2 + C1 \times C2 \times Ls \quad (17)$$

The capacitances C0y, C1, and C2 are represented by the equations (1), (4), and (5), respectively, using the capacitances C0, C1a, C1b, C2a, and C2b of the respective capacitors 60, 4s, 4b, 5a, and 5b shown in FIG. 3. Therefore, the attenuation pole frequencies fp1 and fp2 of the high frequency filter shown in FIG. 3 are represented, respectively, using the capacitances C0, C1a, C1b, C2a, and C of the respective capacitors 60, 4s, 4b, 5a, and 5b, and the inductances Ls, L1, and L2 of the respective inductors 2, 3a, and 3b shown in FIG. 3. Accordingly, the attenuation pole frequencies fp1 and fp2 of the high frequency filter shown in FIG. 3 can be controlled by controlling the element values of the respective components shown in FIG. 3. The high frequency circuit shown in FIG. 1 is equivalent to the circuit shown in FIG. 3, and it is configured to control the attenuation pole frequencies fp1 and fp2 by replacing the capacitor 60 shown in FIG. 3 by the varactor diode 6 and controlling the capacitance Cv of the varactor diode 6.

Figure 2:
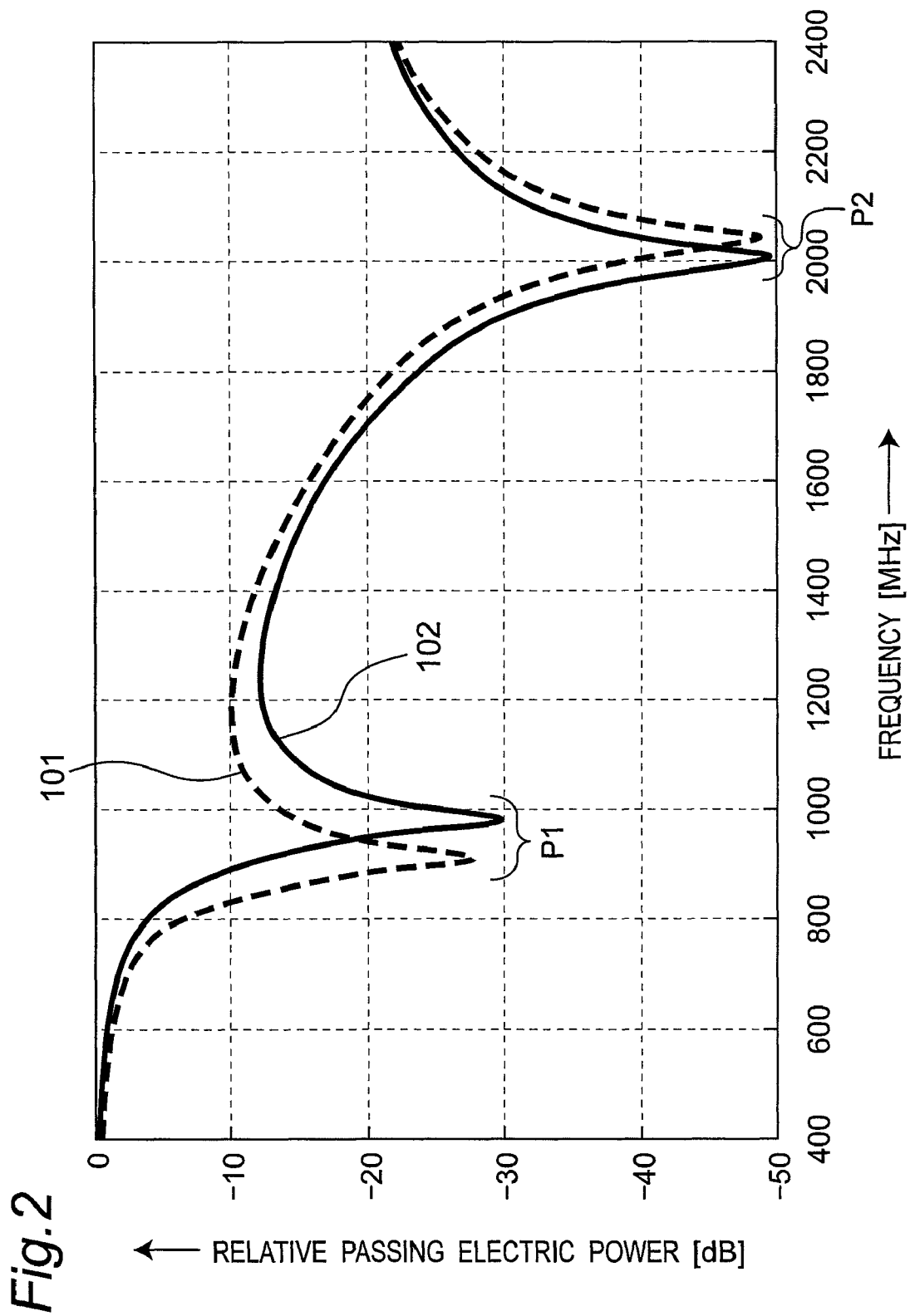
FIG. 2 is a graph showing a relationship between a frequency and a relative passing electric power of the high frequency filter shown in FIG. 1.

FIG. 2 is a graph showing a relationship between a frequency and a relative passing electric power of the high frequency filter shown in FIG. 1. Referring to FIG. 2, a characteristic 101 shows the relationship between the frequency and the relative passing electric power of the high frequency filter shown in FIG. 1 when the inductance Ls of the inductor 2 is set to 18.0 nH, the inductance L1 of the inductor 3a is set to 3.0 nH, the capacitances C1a and C1b of the capacitors 4a and 5a are set to 4.2 pF, respectively, the inductance L2 of the inductor 3b is set to 13.2 nH, the capacitances C2a and C2b of the capacitors 4b and 5b are set to 4.0 pF, respectively, and the DC voltage Vc is set so as to set the capacitance Cv of the varactor diode 6 to 0.5 pF. In addition, a characteristic 102 shows the relationship between the frequency and the relative passing electric power of the high frequency filter shown in FIG. 1 when the DC voltage Vc is set so as to set the capacitance Cv of the varactor diode 6 to 0.1 pF, and the values of the other elements are set to be equal to those for the characteristic 101.

In the present embodiment and the subsequent embodiments, a resistance value Re of the resistor 7 provided to ground the anode of the varactor diode 6 in a DC fashion is set to be higher than 10 kΩ, and the inductance Lc of the high frequency blocking inductor 8 is set to be higher than 10 μH, in consideration of a frequency band of 470 MHz to 770 MHz for the digital television broadcasting signals inputted to the high frequency filter. Preferably, the resistance value Re and the inductance Lc are set as large as possible so as to reduce the influence of leakage of high frequency signals as much as possible.

As shown in FIG. 2, the high frequency filter shown in FIG. 1 is a low-pass filter having the attenuation pole P1 in a lower frequency region and the attenuation pole P2 in a higher frequency region. As apparent from FIG. 2, by reducing the capacitance Cv of the varactor diode 6, the attenuation pole frequency fp1 of the attenuation pole P1 becomes higher and the attenuation pole frequency fp2 of the attenuation pole P2 becomes lower.

As described above in detail, the high frequency filter according to the first embodiment can simultaneously change the two attenuation pole frequencies fp1 and fp2 by changing the capacitance Cv of one varactor diode 6. Therefore, as compared with the filter device having a plurality of variable capacitive elements according to the prior art, the high frequency filter according to the first embodiment exhibits such a unique advantageous effect that the high frequency filter smaller in size can be realized and manufacturing cost can be reduced. In addition, as described above, although the frequencies at which signals are to be attenuated are different from each other depending on the desired channels of the digital television broadcasting, the high frequency filter according to the present embodiment can provide a plurality of different pairs of attenuation pole frequencies using one high frequency filter. Therefore, as compared with the high frequency filter according to the prior art in which the attenuation pole frequency thereof cannot be changed, the high frequency filter according to the present embodiment exhibits such a unique advantageous effect that the high frequency filter smaller in size can be realized and manufacturing cost can be reduced by decreasing the number of the serial resonance circuits.

It is to be noted that the inductor 3a and the capacitor 4a may be replaced by each other and connected in the serial resonance circuit 31, and that the inductor 3b and the capacitor 4b may be replaced by each other and connected in the serial resonance circuit 32. In addition, the high frequency filter shown in FIG. 1 includes the two serial resonance circuits 31 and 32. However, the present invention is not limited to this, and the high frequency filter may include a plurality of three or more serial resonance circuits (See, for example, a high frequency filter according to a seventh embodiment described below).

Second Embodiment

Figure 9:
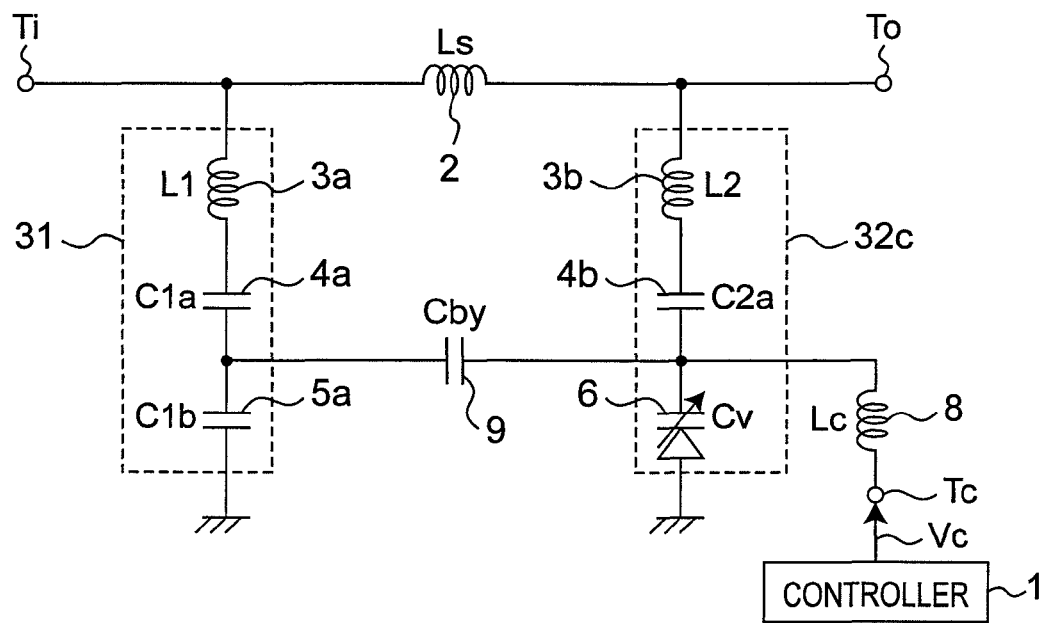
FIG. 9 is a circuit diagram of a variable-frequency high frequency filter according to a second embodiment of the present invention.

FIG. 9 is a circuit diagram of a variable-frequency high frequency filter according to a second embodiment of the present invention. Referring to FIG. 9, the high frequency filter according to the second embodiment is constituted by including the controller 1, the inductor 2 connected between the input terminal Ti and the output terminal To, the serial resonance circuit 31 connected between the connection point between the input terminal Ti and one end of the inductor 2 and the ground, a serial resonance circuit 32c connected between the connection point between the output terminal To and the other end of the inductor 2 and the ground, a capacitor 9, and the choke coil 8. In this case, the serial resonance circuit 32c is a circuit in which the inductor 3b, the capacitor 4b, and the varactor diode 6 are connected in series in this order. One end of the inductor 3b is connected to the connection point between the output terminal To and the other end of the inductor 2. Further, the anode of the varactor diode 6 is grounded, and the cathode of the varactor diode 6 is connected to the control terminal Tc via the high frequency blocking choke coil 8. Further, the capacitor 9 is connected between the connection point between capacitors 4a and 5a and a connection point between the capacitor 4b and the varactor diode 6.

As shown in FIG. 9, as compared with the high frequency filter according to the first embodiment shown in FIG. 1, the high frequency filter according to the second embodiment is characterized by having the serial resonance circuit 32c including the capacitor 4b and the varactor diode 6 instead of the serial resonance circuit 32. In this case, the anode of the varactor diode 6 is grounded, and the cathode of the varactor diode 6 is connected to the input terminal Ti via the capacitor 9 and the capacitor 4a of the serial resonance circuit 31 and connected to the output terminal To via the capacitor 4b of the serial resonance circuit 32c. Therefore, the DC component of the DC voltage Vc does not leak to the input terminal Ti and the output terminal To, and the resistor 7 of the high frequency filter shown in FIG. 1 can be omitted.

Figure 10:
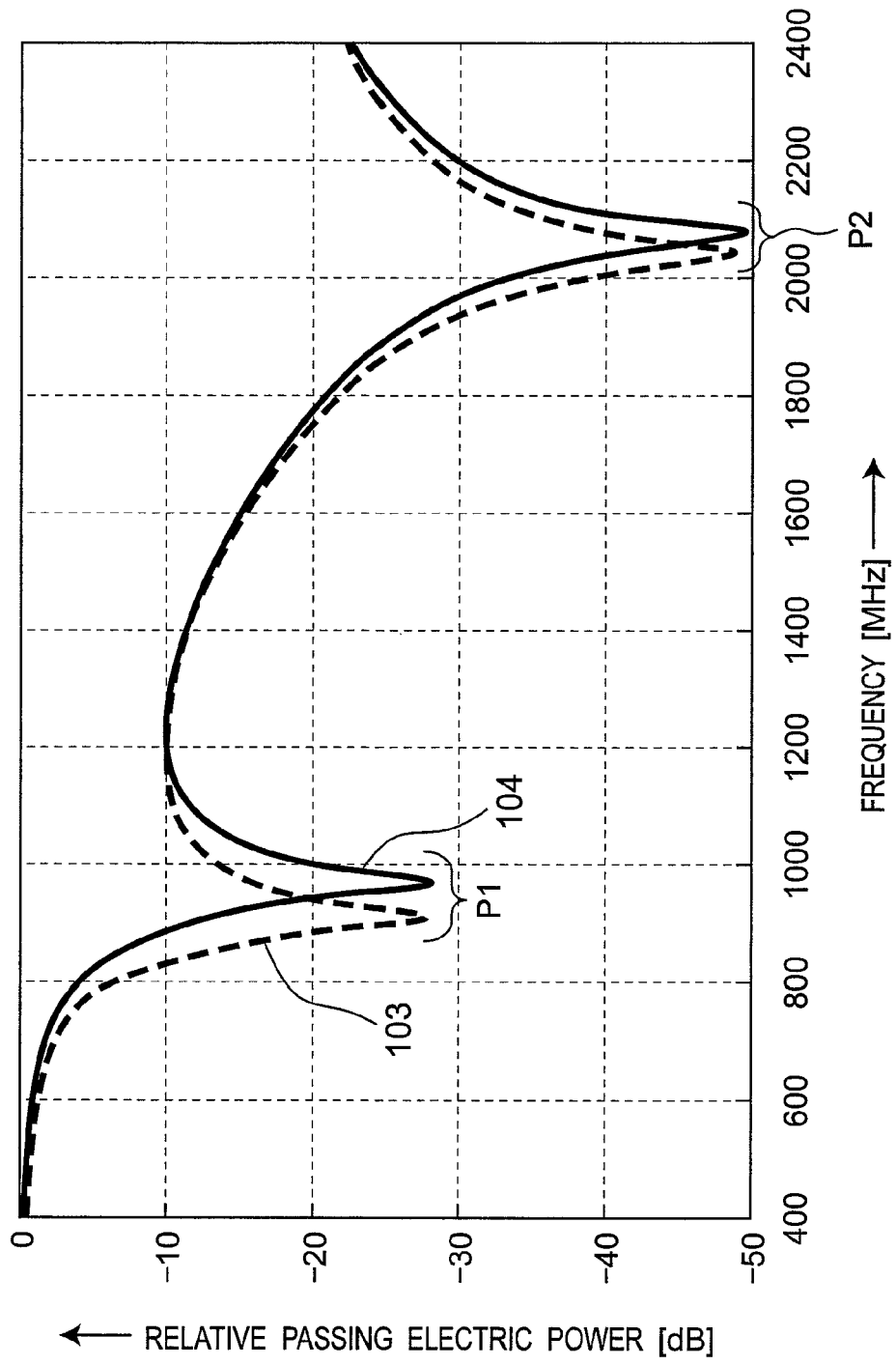
FIG. 10 is a graph showing a relationship between a frequency and a relative passing electric power of the high frequency filter shown in FIG. 9.

FIG. 10 is a graph showing a relationship between a frequency and a relative passing electric power of the high frequency filter shown in FIG. 9. Referring to FIG. 10, a characteristic 103 shows the relationship between the frequency and the relative passing electric power of the high frequency filter shown in FIG. 9 when the inductance Ls of the inductor 2 is set to 18.0 nH, the inductance L1 of the inductor 3a is set to 3.0 nH, the capacitances C1a and C1b of the capacitors 4a and 5a are set to 4.2 pF, respectively, the inductance L2 of the inductor 3b is set to 13.2 nH, the capacitance C2a of the capacitor 4b is set to 4.0 pF, a capacitance Cby of the capacitor 9 is set to 0.5 pF, and the DC voltage Vc is set so as to set the capacitance Cv of the varactor diode 6 to 4.0 pF. In addition, a characteristic 104 shows the relationship between the frequency and the relative passing electric power of the high frequency filter shown in FIG. 9 when the DC voltage Vc is set so as to set the capacitance Cv of the varactor diode 6 to 3.0 pF, and the values of the other elements are set to be equal to those for the characteristic 103.

As shown in FIG. 10, the high frequency filter shown in FIG. 9 is a low-pass filter having an attenuation pole P1 in a lower frequency region and an attenuation pole P2 in a higher frequency region. As apparent from FIG. 10, by reducing the capacitance Cv of the varactor diode 6, an attenuation pole frequency fp1 of the attenuation pole P1 becomes higher and an attenuation pole frequency fp2 of the attenuation pole P2 becomes higher.

As described above in detail, the high frequency filter according to the second embodiment can simultaneously change the two attenuation pole frequencies fp1 and fp2 by changing the capacitance Cv of one varactor diode 6. Therefore, as compared with the filter device having a plurality of variable capacitive elements according to the prior art, the high frequency filter according to the second embodiment exhibits such a unique advantageous effect that the high frequency filter smaller in size can be realized and manufacturing cost can be reduced. Further, it is possible to omit the resistor 7 as compared with the high frequency filter according to the first embodiment. Therefore, it is possible to further reduce the size of the high frequency filter and the manufacturing cost.

It is to be noted that the inductor 3a and the capacitor 4a may be replaced by each other and connected in the serial resonance circuit 31, and that the inductor 3b and the capacitor 4b may be replaced by each other and connected in the serial resonance circuit 32c.

Third Embodiment

Figure 11:
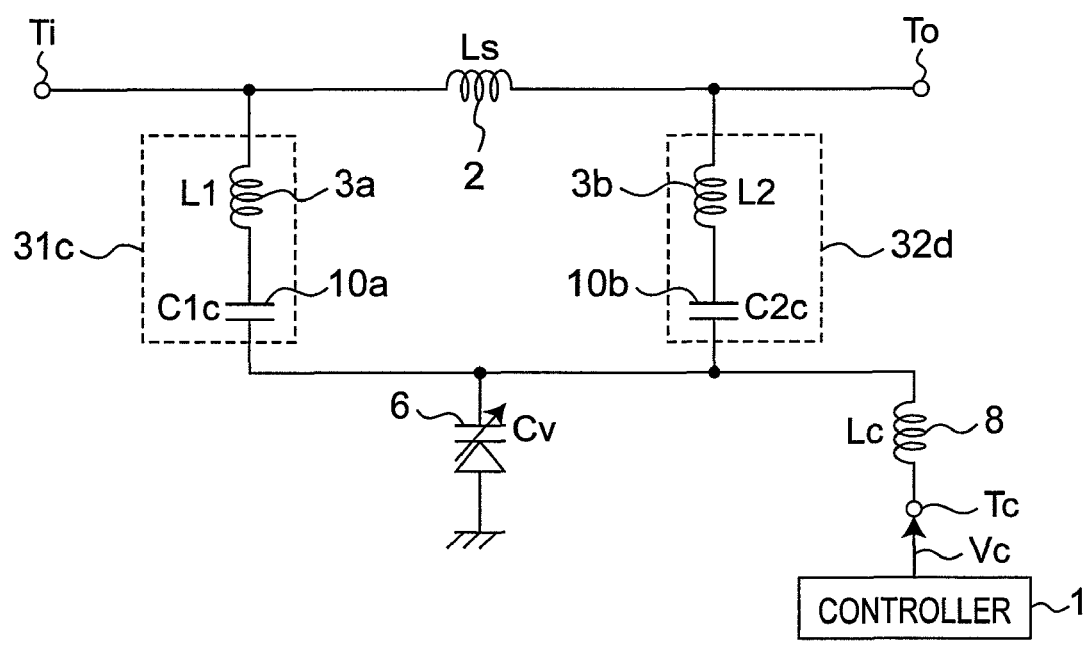
FIG. 11 is a circuit diagram of a variable-frequency high frequency filter according to a third embodiment of the present invention.

FIG. 11 is a circuit diagram of a variable-frequency high frequency filter according to a third embodiment of the present invention, and it shows a circuit equivalent to the circuit shown in FIG. 5. Referring to FIG. 11, the high frequency filter according to the third embodiment is constituted by including the controller 1, the inductor 2 connected between the input terminal Ti and the output terminal To, a serial resonance circuit 31c connected between the connection point between the input terminal Ti and one end of the inductor 2 and the ground, a serial resonance circuit 32d connected between the connection point between the output terminal To and the other end of the inductor 2 and the ground, the varactor diode 6 connected between a connection point between the serial resonance circuits 31c and 32d and the ground, and the choke coil 8. In this case, the serial resonance circuit 31c includes the inductor 3a and a capacitor 10a, and one end of the inductor 3a is connected to the connection point between the input terminal Ti and one end of the inductor 2. Further, the serial resonance circuit 32d includes the inductor 3b and a capacitor 10b, and one end of the inductor 3b is connected to the connection point between the output terminal To and the other end of the inductor 2. Further, the anode of the varactor diode 6 is grounded and the cathode of the varactor diode 6 is connected to the control terminal Tc via the connection point between the serial resonance circuits 31c and 32d and the choke coil 8.

Referring to FIG. 11, the cathode of the varactor diode 6 is connected to the input terminal Ti via the capacitor 10a, and it is connected to the output terminal To via the capacitor 10b. Therefore, the DC component of the DC voltage Vc does not leak to the input terminal Ti and the output terminal To.

Figure 12:
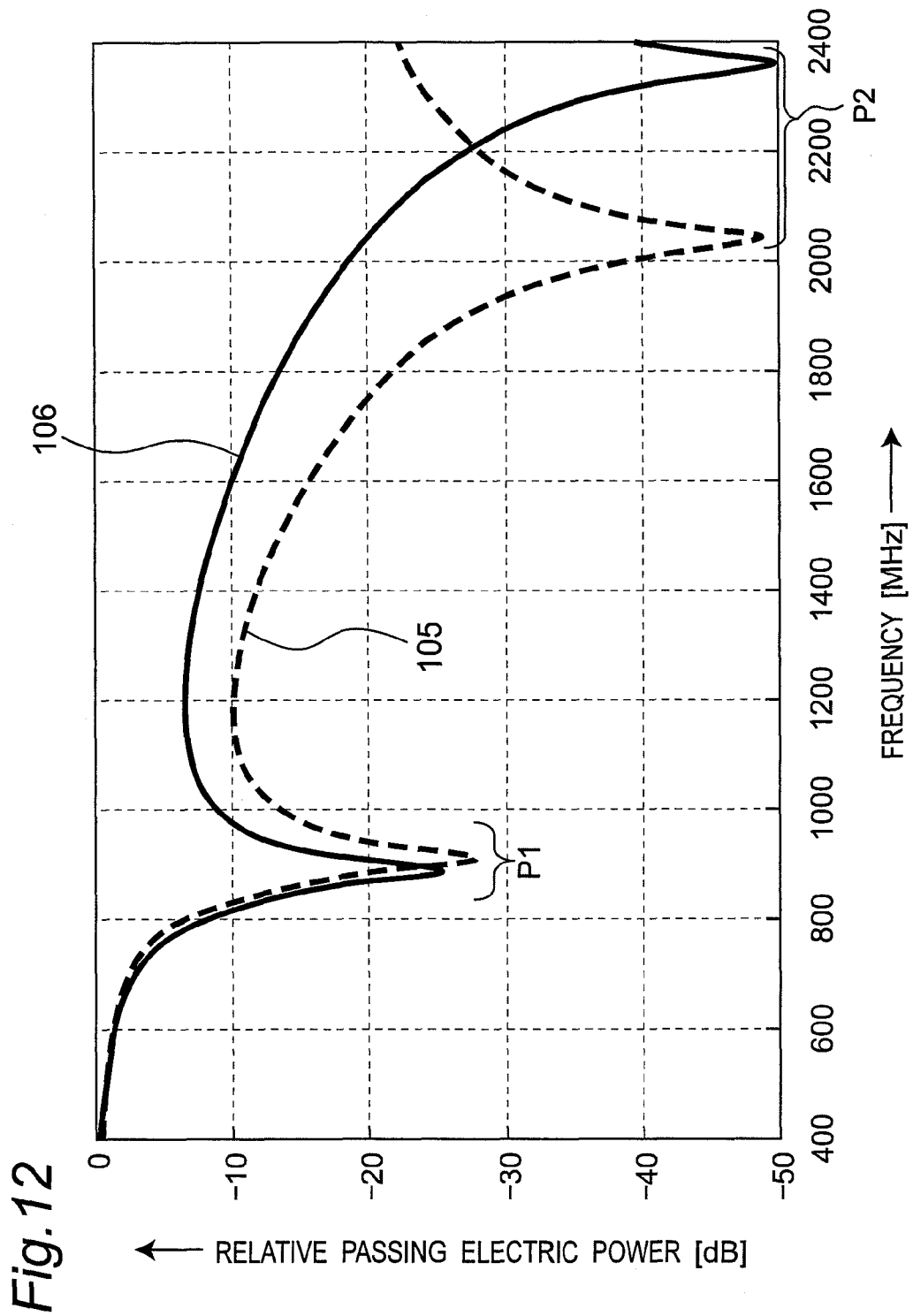
FIG. 12 is a graph showing a relationship between a frequency and a relative passing electric power of the high frequency filter shown in FIG. 11.

FIG. 12 is a graph showing a relationship between a frequency and a relative passing electric power of the high frequency filter shown in FIG. 11. Referring to FIG. 12, a characteristic 105 shows the relationship between the frequency and the relative passing electric power of the high frequency filter shown in FIG. 11 when the inductance Ls of the inductor 2 is set to 18.0 nH, the inductance L1 of the inductor 3a is set to 3.0 nH, a capacitance C1c of the capacitor 10a is set to 2.33 pF, the inductance L2 of the inductor 3b is set to 13.2 nH, a capacitance C2c of the capacitor 10b is set to 2.22 pF, and the DC voltage Vc is set so as to set the capacitance Cv of the varactor diode 6 to 41.8 pF. In addition, a characteristic 106 shows the relationship between the frequency and the relative passing electric power of the high frequency filter shown in FIG. 11 when the DC voltage Vc is set so as to set the capacitance Cv of the varactor diode 6 to 11.8 pF, and the values of the other elements are set to be equal to those for the characteristic 105.

As shown in FIG. 12, the high frequency filter shown in FIG. 11 is a low-pass filter having an attenuation pole P1 in a lower frequency region and an attenuation pole P2 in a higher frequency region. As apparent from FIG. 12, by reducing the capacitance Cv of the varactor diode 6, an attenuation pole frequency fp1 of the attenuation pole P1 becomes lower and an attenuation pole frequency fp2 of the attenuation pole P2 becomes higher.

As described above in detail, the high frequency filter according to the third embodiment can simultaneously change the two attenuation pole frequencies fp1 and fp2 by changing the capacitance Cv of one varactor diode 6. Therefore, as compared with the filter device having a plurality of variable capacitive elements according to the prior art, the high frequency filter according to the third embodiment exhibits such a unique advantageous effect that the high frequency filter smaller in size can be realized and manufacturing cost can be reduced. In addition, it is possible to decrease the number of capacitors by two and omit the resistor 7 as compared with the high frequency filter according to the first embodiment. Therefore, it is possible to further reduce the size of the high frequency filter and the manufacturing cost.

It is to be noted that the inductor 3a and the capacitor 10a may be replaced by each other and connected in the serial resonance circuit 31c, and that the inductor 3b and the capacitor 10b may be replaced by each other and connected in the serial resonance circuit 32d.

Fourth Embodiment

Figure 13:
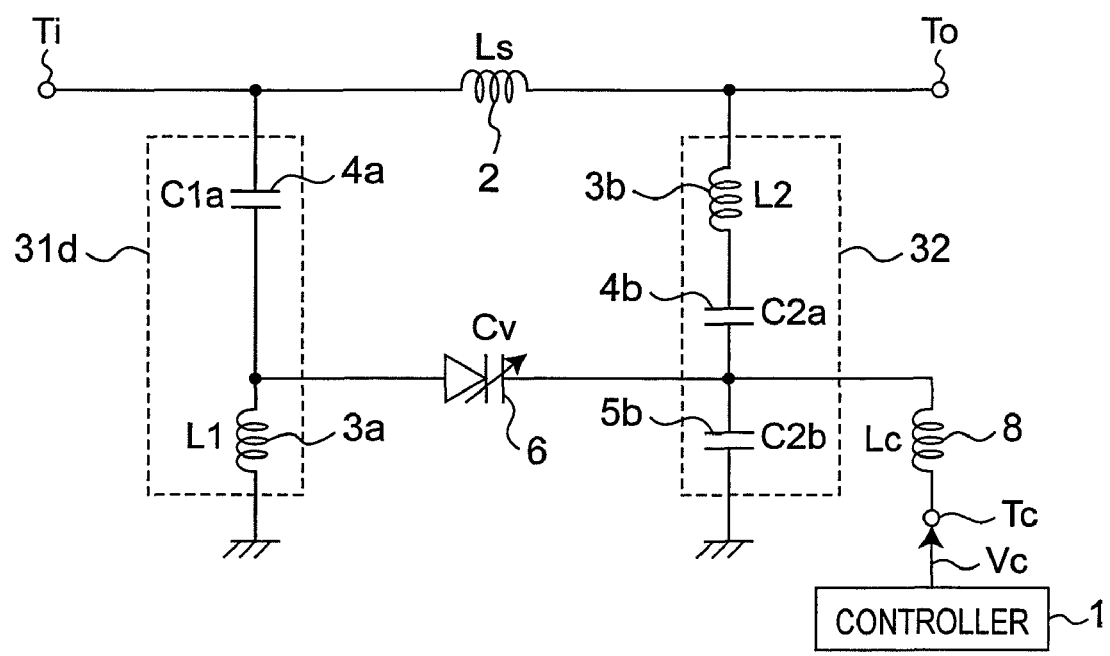
FIG. 13 is a circuit diagram of a variable-frequency high frequency filter according to a fourth embodiment of the present invention.
Figure 14:
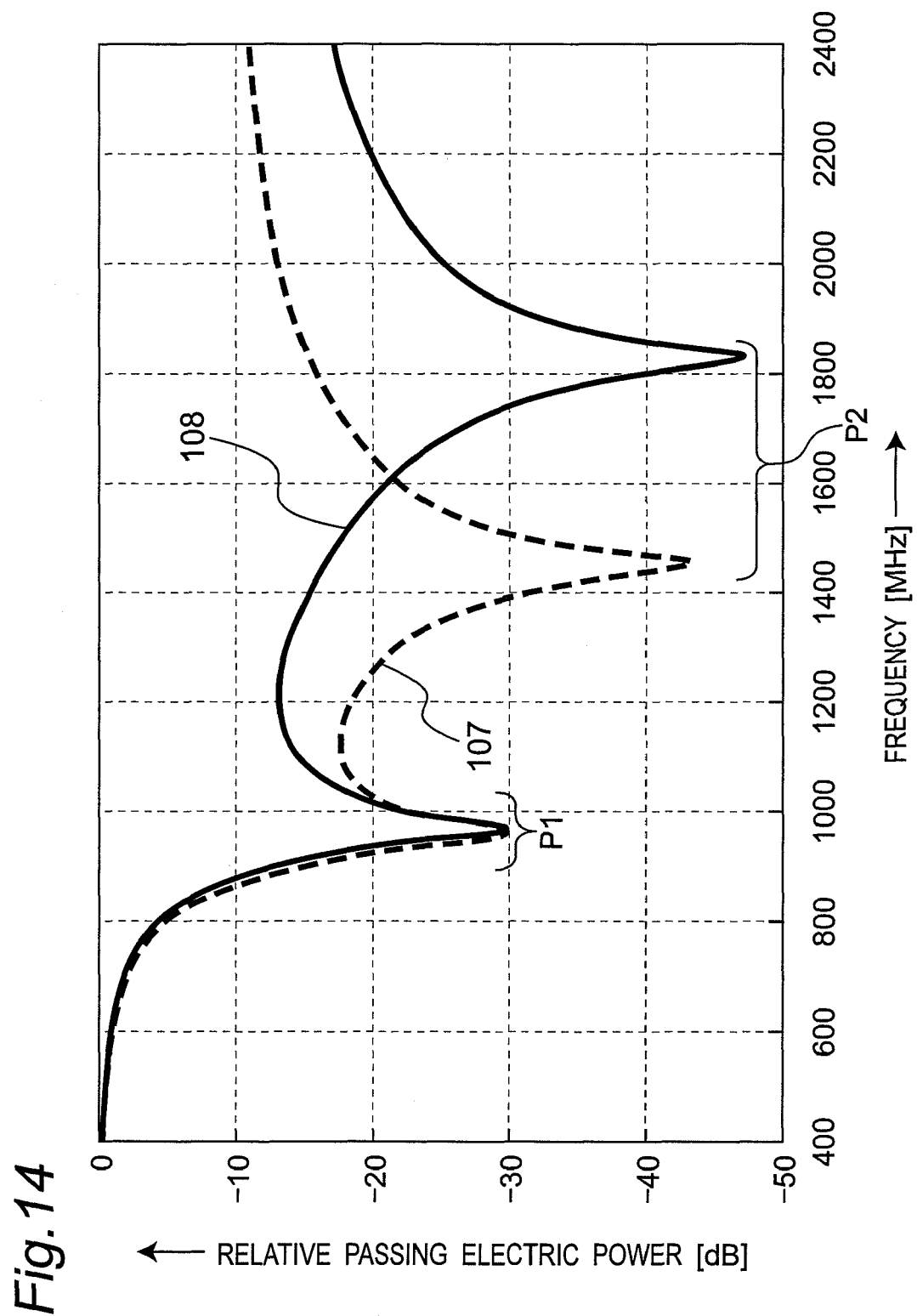
FIG. 14 is a graph showing a relationship between a frequency and a relative passing electric power of the high frequency filter shown in FIG. 13.

FIG. 13 is a circuit diagram of a variable-frequency high frequency filter according to a fourth embodiment of the present invention. Referring to FIG. 13, the high frequency filter according to the fourth embodiment is constituted by including the controller 1, the inductor 2 connected between the input terminal Ti and the output terminal To, a serial resonance circuit 31d connected between the connection point between the input terminal Ti and one end of the inductor 2 and the ground, the serial resonance circuit 32 connected between the connection point between the output terminal To and the other end of the inductor 2 and the ground, the varactor diode 6, and the choke coil 8. In this case, the serial resonance circuit 31d includes the capacitor 4a and the inductor 3a. In addition, the anode of the varactor diode 6 is grounded via a connection point between the capacitor 4a and the inductor 3a, and the inductor 3a. Further, the cathode of the varactor diode 6 is connected to the control terminal Tc via the connection point between the capacitors 4b and 5b, and the choke coil 8.

As shown in FIG. 13, as compared with the high frequency filter according to the first embodiment shown in FIG. 1, the high frequency filter according to the fourth embodiment is characterized by having the serial resonance circuit 32d including the capacitor 4a and the inductor 3a instead of the serial resonance circuit 32. In this case, the anode of the varactor diode 6 is connected to the input terminal Ti via the capacitor 4a of the serial resonance circuit 31d, and it is grounded via the inductor 3a of the serial resonance circuit 31d. In addition, the cathode of the varactor diode 6 is connected to the output terminal To via the capacitor 4b of the serial resonance circuit 32. Therefore, the DC component of the DC voltage Vc does not leak to the input terminal Ti and the output terminal To, and it is possible to omit the resistor 7 as compared with the high frequency filter shown in FIG. 1. frequency fp1 of the attenuation pole P1 becomes higher and an attenuation pole frequency fp2 of the attenuation pole P2 becomes higher.

As described above in detail, the high frequency filter according to the fourth embodiment can simultaneously change the two attenuation pole frequencies fp1 and fp2 by changing the capacitance Cv of one varactor diode 6. Therefore, as compared with the filter device having a plurality of variable capacitive elements according to the prior art, the high frequency filter according to the fourth embodiment exhibits such a unique advantageous effect that the high frequency filter smaller in size can be realized and manufacturing cost can be reduced. In addition, it is possible to decrease the number of capacitors by one and omit the resistor 7, as compared with the high frequency filter according to the first embodiment. Therefore, it is possible to further reduce the size of the high frequency filter and the manufacturing cost.

In the serial resonance circuit 32e, the inductor 3b and the capacitor 4b may be replaced by each other and connected.

Fifth Embodiment

Figure 15:
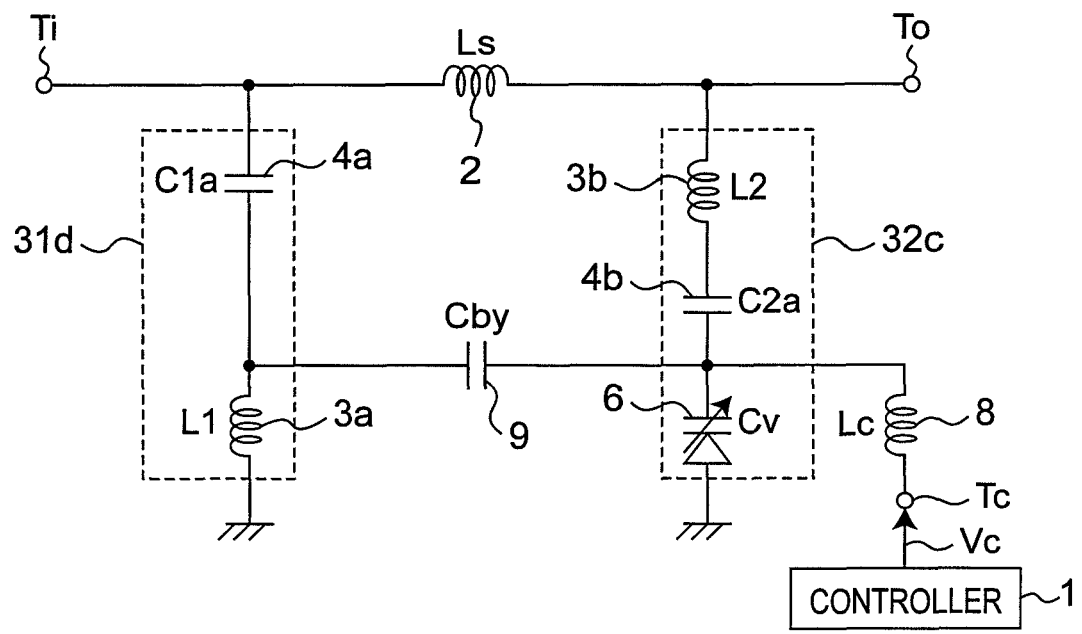
FIG. 15 is a circuit diagram of a variable-frequency high frequency filter according to a fifth embodiment of the present invention.

FIG. 15 is a circuit diagram of a variable-frequency high frequency filter according to a fifth embodiment of the present invention. Referring to FIG. 15, the high frequency filter according to the fifth embodiment is constituted by including the controller 1, the inductor 2 connected between the input terminal Ti and the output terminal To, the serial resonance circuit 31d connected between the connection point between the input terminal Ti and one end of the inductor 2 and the ground, the serial resonance circuit 32c connected between the connection point between the output terminal To and the other end of the inductor 2 and the ground, the capacitor 9, and the choke coil 8. In this case, the capacitor 9 is connected between the connection point between the capacitor 4a and the inductor 3a, and the connection point between the capacitor 4b and the varactor diode 6.

As shown in FIG. 15, as compared with the high frequency filter according to the second embodiment shown in FIG. 9, the high frequency filter according to the fifth embodiment is characterized in that the cathode of the varactor diode 6 is connected to the input terminal Ti via the capacitor 4a of the serial resonance circuit 31d, it is grounded via the inductor 3a of the serial resonance circuit 31d, and it is connected to the output terminal To via the capacitor 4b of the serial resonance circuit 32c. Therefore, the DC component of the DC voltage Vc does not leak to the input terminal Ti and the output terminal To, and the number of capacitors can be decreased by one, as compared with the high frequency filter shown in FIG. 9.

Figure 16:
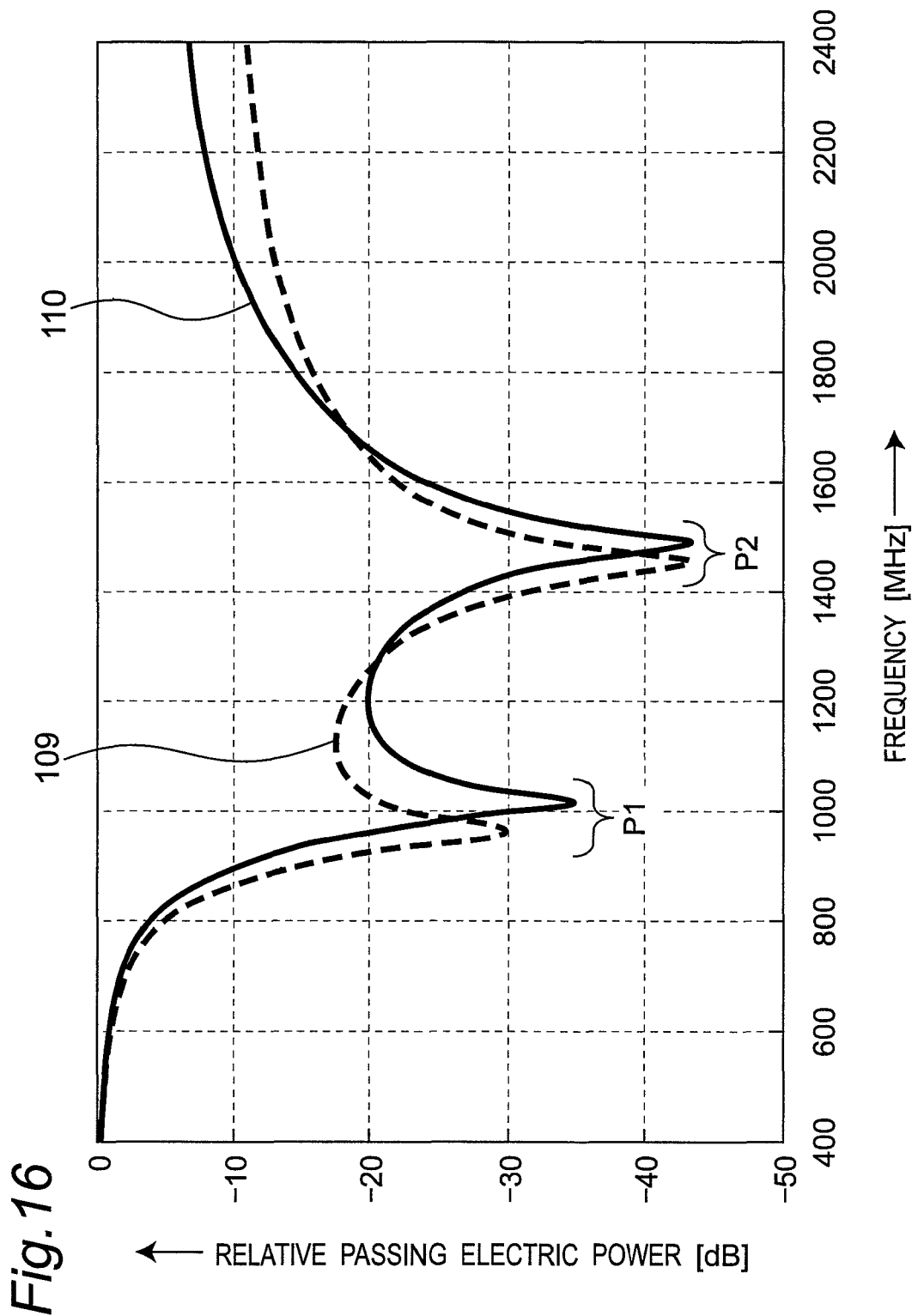
FIG. 16 is a graph showing a relationship between a frequency and a relative passing electric power of the high frequency filter shown in FIG. 15.

FIG. 16 is a graph showing a relationship between a frequency and a relative passing electric power of the high frequency filter shown in FIG. 15. Referring to FIG. 16, a characteristic 109 shows the relationship between the frequency and the relative passing electric power of the high frequency filter shown in FIG. 15 when the inductance Ls of the inductor 2 is set to 18.0 nH, the inductance L1 of the inductor 3a is set to 13.2 nH, the capacitance C1a of the capacitor 4a is set to 2.0 pF, the inductance L2 of the inductor 3b is set to 3.0 nH, the capacitance C2a of the capacitor 4b is set to 4.2 pF, the capacitance Cby of the capacitor 9 is set to 0.5 pF, and the DC voltage Vc is set so as to set the capacitance Cv of the varactor diode 6 to 4.2 pF. Further, a characteristic 110 shows the relationship between the frequency and the relative passing electric power of the high frequency filter shown in FIG. 15 when the DC voltage Vc is set so as to set the capacitance Cv of the varactor diode 6 to 1.2 pF, and the values of the other elements are set to be equal to those for the characteristic 109.

As shown in FIG. 16, the high frequency filter shown in FIG. 15 is a low-pass filter having an attenuation pole P1 in a lower frequency region and an attenuation pole P2 in a higher frequency region. As apparent from FIG. 16, by reducing the capacitance Cv of the varactor diode 6, an attenuation pole frequency fp1 of the attenuation pole P1 becomes higher and an attenuation pole frequency fp2 of the attenuation pole P2 becomes higher.

As described above in detail, the high frequency filter according to the fifth embodiment can simultaneously change the two attenuation pole frequencies fp1 and fp2 by changing the capacitance Cv of one varactor diode 6. Therefore, as compared with the filter device having a plurality of variable capacitive elements according to the prior art, the high frequency filter according to the fifth embodiment exhibits such a unique advantageous effect that the high frequency filter smaller in size can be realized and manufacturing cost can be reduced. Further, it is possible to decrease the number of capacitors by one as compared with the high frequency filter according to the second embodiment. Therefore, it is possible to further reduce the size of the high frequency filter and the manufacturing cost.

It is to be noted that the inductor 3b and the capacitor 4b may be replaced by each other and connected in the serial resonance circuit 32c.

Sixth Embodiment

Figure 17:
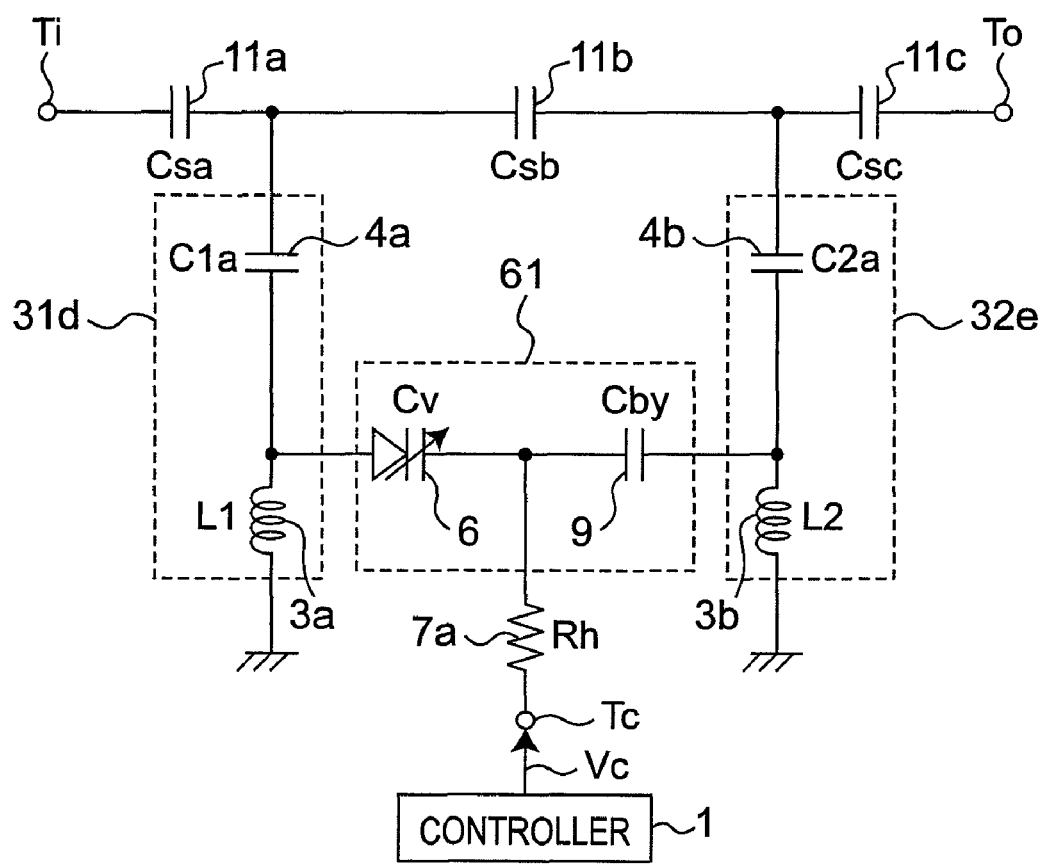
FIG. 17 is a circuit diagram of a variable-frequency high frequency filter according to a sixth embodiment of the present invention.

FIG. 17 is a circuit diagram of a variable-frequency high frequency filter according to a sixth embodiment of the present invention. Referring to FIG. 17, the high frequency filter according to the sixth embodiment is constituted by including the controller 1, capacitors 11a, 11b, and 11c connected in series between the input terminal Ti and the output terminal To, the serial resonance circuit 31d which is connected between a connection point between the capacitors 11a and 11b and the ground, and includes the capacitor 4a and the inductor 3a, a serial resonance circuit 32e which is connected between a connection point between the capacitors 11b and 11c and the ground, and includes the capacitor 4b and the inductor 3b, a serial connection circuit 61, and a high frequency blocking resistor 7a. In this case, the serial connection circuit 61 includes the varactor diode 6 and the capacitor 9, and the serial connection circuit 61 is connected between the connection point between the capacitor 4a and the inductor 3a and the connection point between the capacitor 4b and the inductor 3b. Further, the resistor 7a is connected between a connection point between the varactor diode 6 and the capacitor 9 and the control terminal Tc.

Referring to FIG. 17, the anode of the varactor diode 6 is connected to the input terminal Ti via the capacitor 4a of the serial resonance circuit 31d, and it is grounded via the inductor 3a of the serial resonance circuit 31d. In addition, the cathode of the varactor diode 6 is connected to the output terminal To via the capacitor 9 and the capacitor 4b of the serial resonance circuit 32e. Therefore, the DC component of the DC voltage Vc does not leak to the input terminal Ti and the output terminal To.

Figure 18:
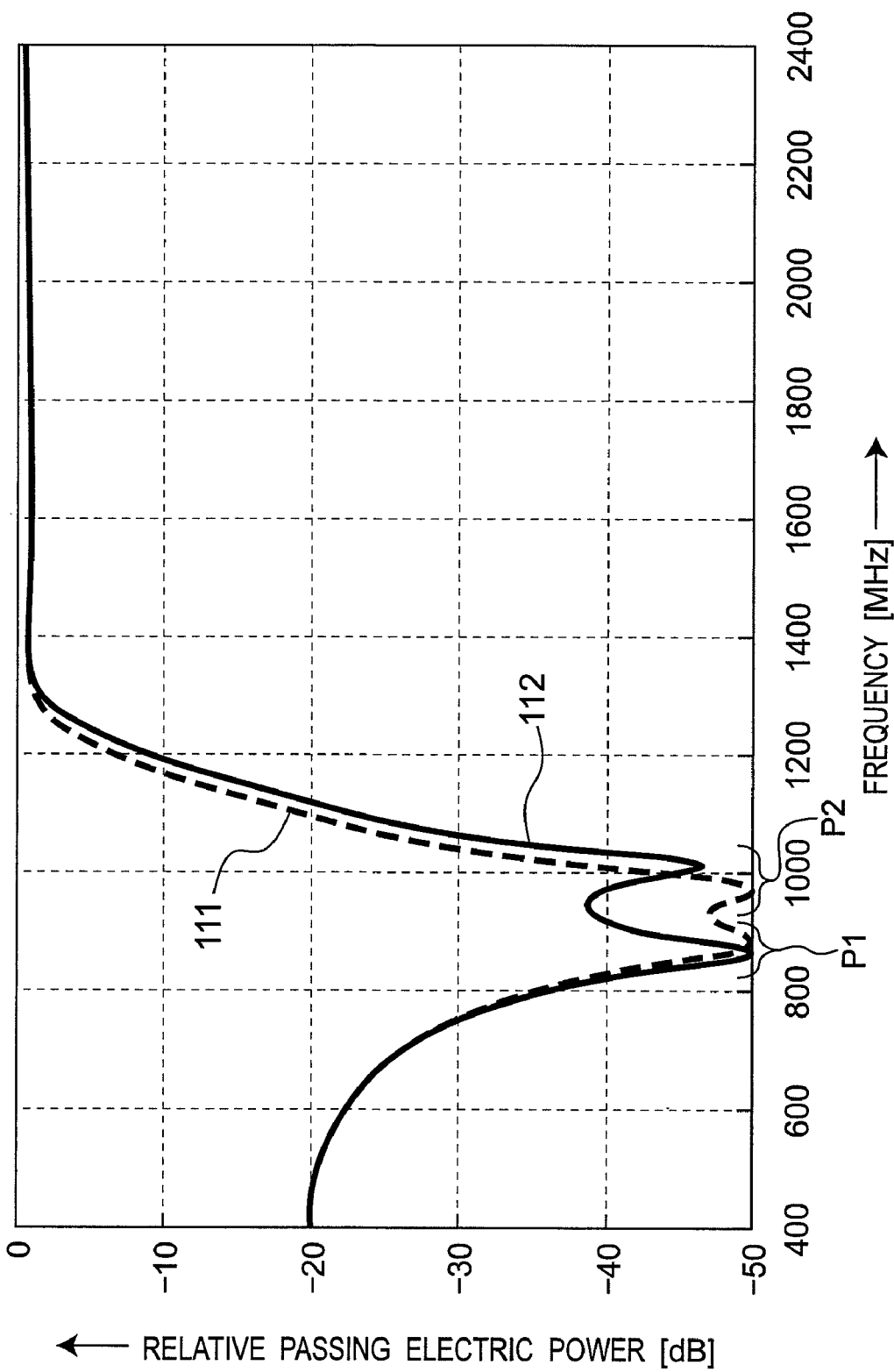
FIG. 18 is a graph showing a relationship between a frequency and a relative passing electric power of the high frequency filter shown in FIG. 17.

FIG. 18 is a graph showing a relationship between a frequency and a relative passing electric power of the high frequency filter shown in FIG. 17. Referring to FIG. 18, a characteristic 111 shows the relationship between the frequency and the relative passing electric power of the high frequency filter shown in FIG. 17 when a capacitance Csa of the capacitor 11a is set to 5.5 pF, a capacitance Csb of the capacitor 11b is set to 3.0 pF, a capacitance Csc of the capacitor 11c is set to 13.0 pF, the inductance L1 of the inductor 3a is set to 3.69 nH, the capacitance C1a of the capacitor 4a is set to 9.53 pF, the inductance L2 of the inductor 3b is set to 5.78 nH, the capacitance C2a of the capacitor 4b is set to 3.99 pF, the capacitance Cby of the capacitor 9 is set to 0.15 pF, and the DC voltage Vc is set so as to set the capacitance Cv of the varactor diode 6 to 0.3 pF. In addition, a characteristic 112 shows the relationship between the frequency and the relative passing electric power of the high frequency filter shown in FIG. 17 when the DC voltage Vc is set so as to set the capacitance Cv of the varactor diode 6 to 0.075 pF, and the values of the other elements are set to be equal to those for the characteristic 111.

A resistance value Rh of the high frequency blocking resistor 7a is set to be higher than 10 kΩ in consideration of a frequency band of 470 MHz to 770 MHz for the digital television broadcasting signals inputted to the high frequency filter. Preferably, the resistance value Rh is set as large as possible so as to reduce the influence of leakage of high frequency signals as much as possible.

As shown in FIG. 18, the high frequency filter shown in FIG. 17 is a high-pass filter having an attenuation pole P1 in a lower frequency region and an attenuation pole P2 in a higher frequency region. As apparent from FIG. 18, by reducing the capacitance Cv of the varactor diode 6, an attenuation pole frequency fp1 of the attenuation pole P1 becomes lower and an attenuation pole frequency fp2 of the attenuation pole P2 becomes higher.

As described above in detail, the high frequency filter according to the sixth embodiment can simultaneously change the two attenuation pole frequencies fp1 and fp2 by changing the capacitance Cv of one varactor diode 6. Therefore, as compared with the filter device having a plurality of variable capacitive elements according to the prior art, the high frequency filter according to the sixth embodiment exhibits such a unique advantageous effect that the high frequency filter smaller in size can be realized and manufacturing cost can be reduced.

In addition, in the high frequency filter according to each of the first to fifth embodiments, the low-pass filter is realized by connecting the inductor 2 of a reactance element between the input terminal Ti and the output terminal To, and the two attenuation pole frequencies fp1 and fp2 of the low-pass filter are simultaneously changed by changing the capacitance Cv of one varactor diode 6. However, the present invention is not limited to this. As described in the sixth embodiment, the high-pass filter can be realized by connecting the capacitors 11a, 11b, and 11c of reactance elements between the input terminal Ti and the output terminal To, and the two attenuation pole frequencies fp1 and fp2 of the high-pass filter can be simultaneously changed by changing the capacitance Cv of one varactor diode 6.

Seventh Embodiment

Figure 19:
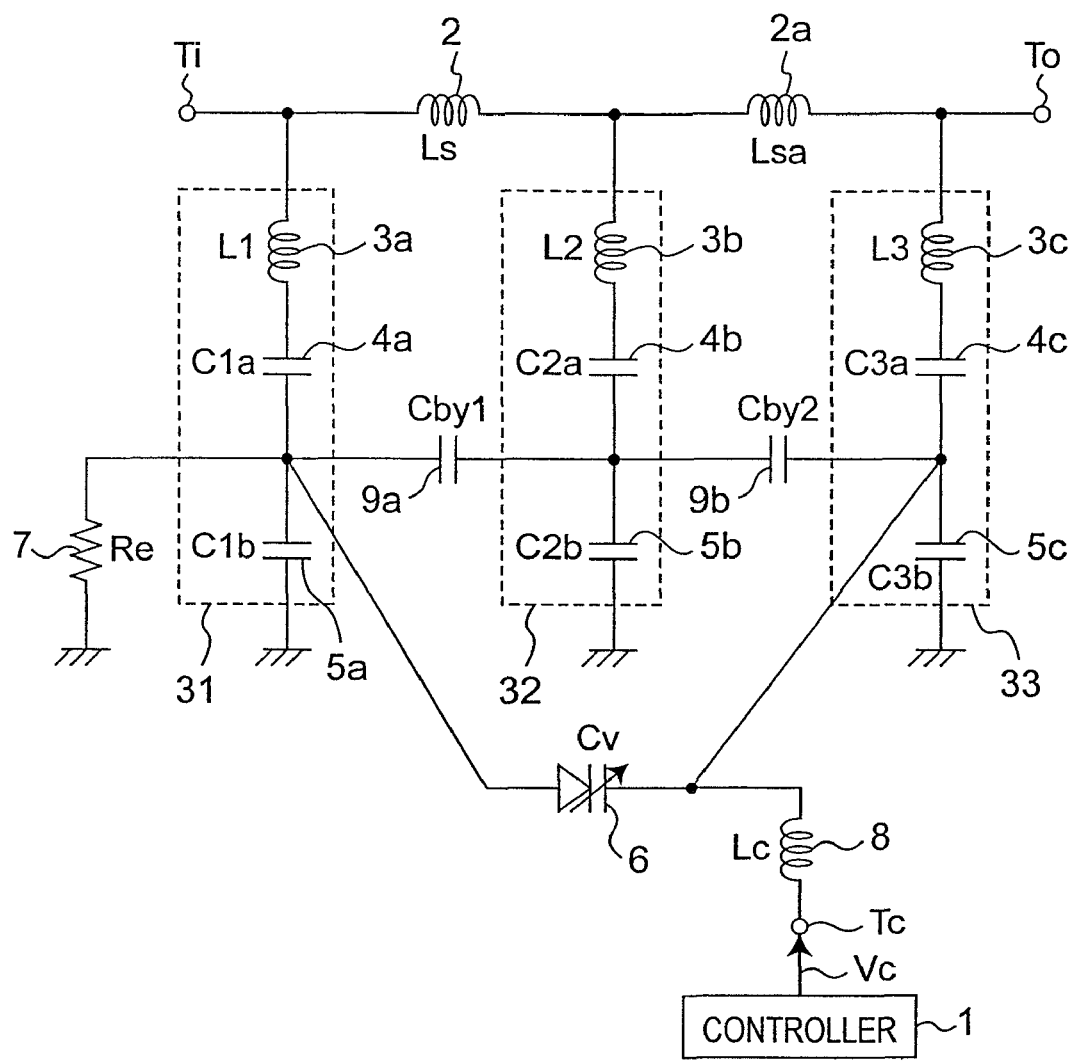
FIG. 19 is a circuit diagram of a variable-frequency high frequency filter according to a seventh embodiment of the present invention.

FIG. 19 is a circuit diagram of a variable-frequency high frequency filter according to a seventh embodiment of the present invention. Referring to FIG. 19, the high frequency filter according to the seventh embodiment is constituted by including the controller 1, inductors 2 and 2a connected between the input terminal Ti and the output terminal To, the serial resonance circuit 31 connected between the connection point between the input terminal Ti and one end of the inductor 2 and the ground, the serial resonance circuit 32 connected between a connection point between the other end of the inductor 2 and one end of the inductor 2a and the ground, a serial resonance circuit 33 connected between a connection point between the other end of the inductor 2a and the output terminal To and the ground, capacitors 9a and 9b, the varactor diode 6, the resistor 7, and the choke coil 8. In this case, the serial resonance circuit 33 is a circuit in which an inductor 3c, a capacitor 4c, and a capacitor 5c are connected in series in this order. One end of the inductor 3c is connected to the connection point between the output terminal To and the other end of the inductor 2a, and one end of the capacitor 5c is grounded. Further, the capacitor 9a is connected between the connection point between the capacitors 4a and 5a, and the connection point between the capacitors 4b and 5b. The capacitor 9b is connected between the connection point between the capacitors 4b and 5b, and a connection point between the capacitors 4c and 5c. Further, the anode of the varactor diode 6 is grounded via the connection point between the capacitors 4a and 5a, and the resistor 7. The cathode of the varactor diode 6 is connected to the connection point between the capacitors 4c and 5c, and it is also connected to the control terminal Tc via the choke coil 8.

As shown in FIG. 19, the anode of the varactor diode 6 is connected to the input terminal Ti via the capacitor 4a of the serial resonance circuit 31, and the cathode of the varactor diode 6 is connected to the output terminal To via the capacitor 4c of the serial resonance circuit 33. Therefore, the DC component of the DC voltage Vc does not leak to the input terminal Ti and the output terminal To.

Figure 20:
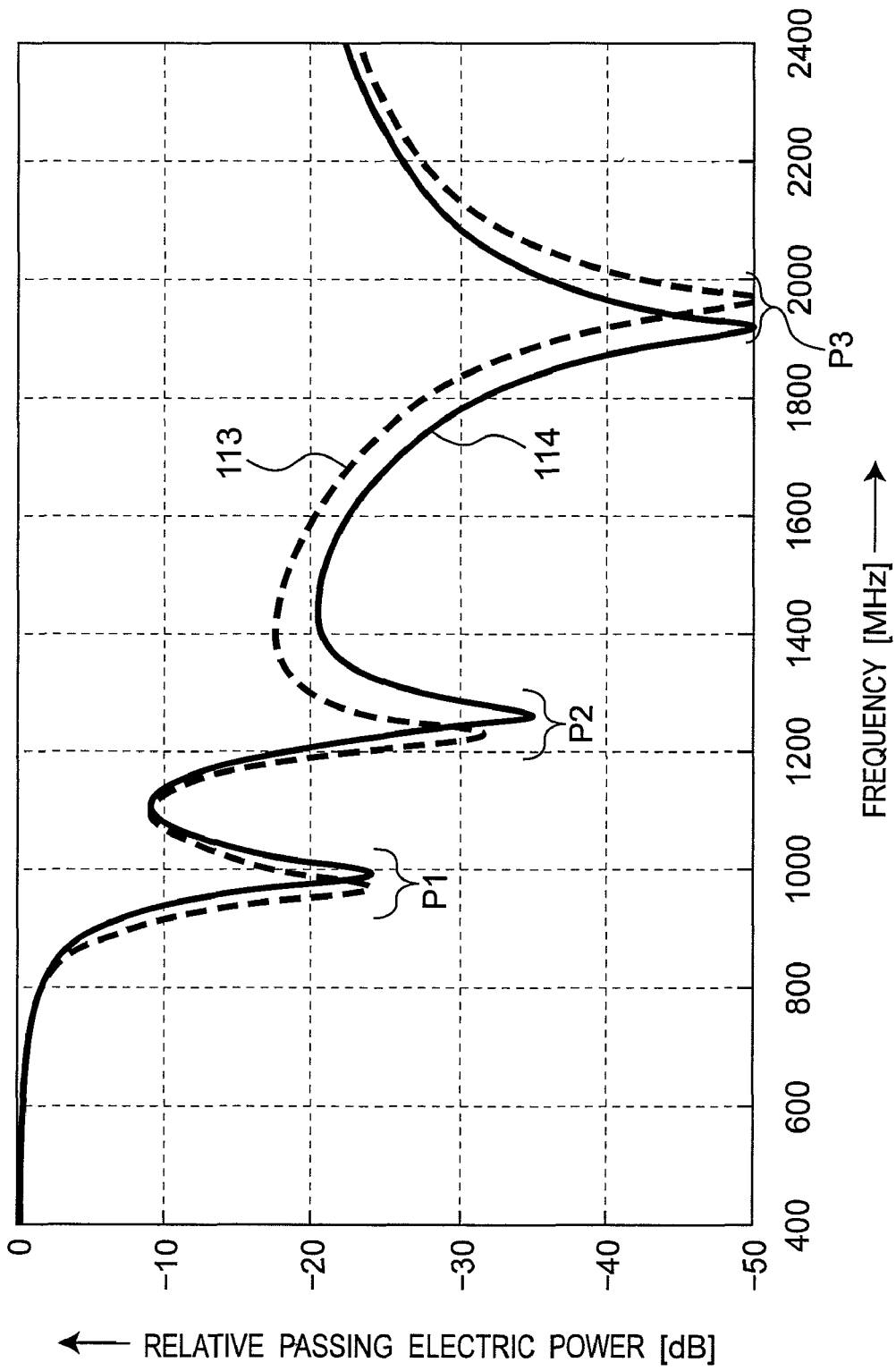
FIG. 20 is a graph showing a relationship between a frequency and a relative passing electric power of the high frequency filter shown in FIG. 19.

FIG. 20 is a graph showing a relationship between a frequency and a relative passing electric power of the high frequency filter shown in FIG. 19. Referring to FIG. 20, a characteristic 113 shows the relationship between the frequency and the relative passing electric power of the high frequency filter shown in FIG. 19 when the inductance Ls of the inductor 2 is set to 8.0 nH, an inductance Lsa of the inductor 2a is set to 6.0 nH, the inductance L1 of the inductor 3a is set to 10.0 nH, the capacitances C1a and C1b of the capacitors 4a and 5a are set to 4.5 pF, respectively, the inductance L2 of the inductor 3b is set to 6.0 nH, capacitances C2a and C2b of the capacitors 4b and 5b are set to 4.0 pF, respectively, an inductance L3 of the inductor 3c is set to 4.5 nH, capacitances C3a and C3b of the capacitors 4c and 5c are set to 3.5 pF, respectively, a capacitance Cby1 of the capacitor 9a is set to 0.5 pF, a capacitance Cby2 of the capacitor 9b is set to 1.0 pF, and the DC voltage Vc is set so as to set the capacitance Cv of the varactor diode 6 to 0.5 pF. In addition, a characteristic 114 shows the relationship between the frequency and the relative passing electric power of the high frequency filter shown in FIG. 19 when the DC voltage Vc is set so as to set the capacitance Cv of the varactor diode 6 to 0.1 pF, and the values of the other elements are set to be equal to those for the characteristic 113.

As shown in FIG. 20, the high frequency filter shown in FIG. 19 is a low-pass filter having an attenuation pole P1 having a lowest attenuation pole frequency, an attenuation pole P2 having an intermediate attenuation pole frequency, and an attenuation pole P3 having a highest attenuation pole frequency. As apparent from FIG. 20, by reducing the capacitance Cv of the varactor diode 6, the attenuation pole frequency of the attenuation pole P1 becomes higher, the attenuation pole frequency of the attenuation pole P2 becomes higher, and the attenuation pole frequency of the attenuation pole P3 becomes lower.

As described above in detail, the high frequency filter according to the seventh embodiment can simultaneously change the three attenuation pole frequencies by changing the capacitance Cv of one varactor diode 6. Therefore, as compared with the filter device having a plurality of variable capacitive elements according to the prior art, the high frequency filter according to the seventh embodiment exhibits such a unique advantageous effect that the high frequency filter smaller in size can be realized and manufacturing cost can be reduced.

It is to be noted that the inductor 3a and the capacitor 4a may be replaced by each other and connected in the serial resonance circuit 31, the inductor 3b and the capacitor 4b may be replaced by each other and connected in the serial resonance circuit 32, and that the inductor 3c and the capacitor 4c may be replaced by each other and connected in the serial resonance circuit 33.

In addition, in FIG. 19, a high-pass filter can be realized by including capacitors of reactance elements instead of the inductors 2 and 2a, and three attenuation pole frequencies of the high-pass filter can be simultaneously changed by changing the capacitance Cv of one varactor diode 6.

Eighth Embodiment

Figure 21:
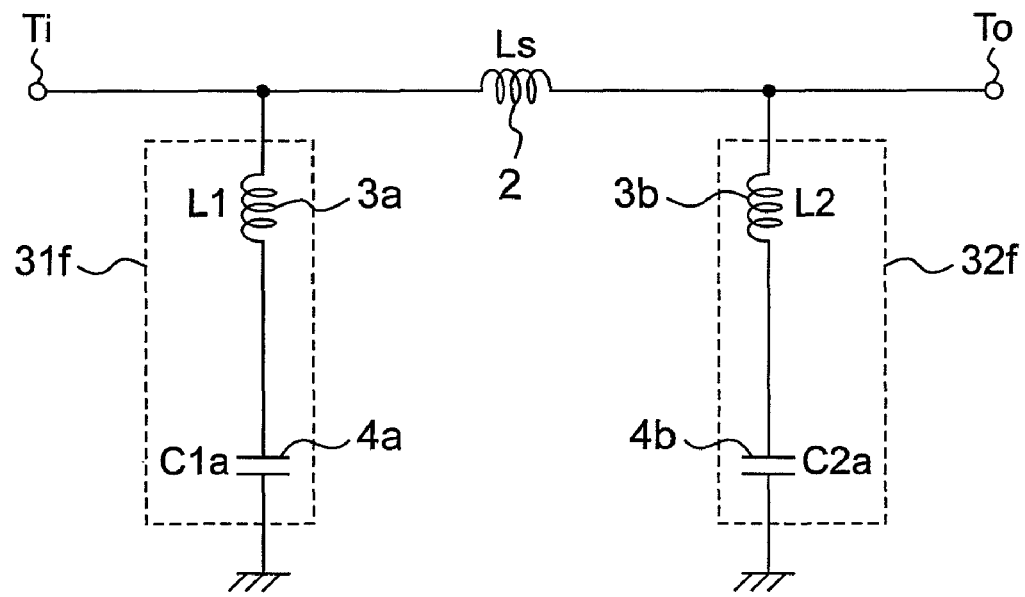
FIG. 21 is a circuit diagram of a high frequency filter according to an eighth embodiment of the present invention.

FIG. 21 is a circuit diagram of a high frequency filter according to an eighth embodiment of the present invention. Referring to FIG. 21, the high frequency filter according to the eighth embodiment is constituted by including the inductor 2 connected between the input terminal Ti and the output terminal To, a serial resonance circuit 31f connected between the connection point between the input terminal Ti and one end of the inductor 2 and the ground, and a serial resonance circuit 32f connected between the connection point between the output terminal To and the other end of the inductor 2 and the ground.

In this case, the serial resonance circuit 31f includes the capacitor 4a having the capacitance C1a and the inductor 3a having the inductance L1, and one end of the inductor 3a is connected between the connection point between the input terminal Ti and one end of the inductor 2. In addition, a resonance frequency fr1 of the serial resonance circuit 31f is represented by the following equation.

[Equation 18]

$$fr1 = \frac{1}{2\pi\sqrt{L1 \times C1a}} \quad (18)$$

In addition, the serial resonance circuit 32f includes the capacitor 4b having the capacitance C2a and the inductor 3b having the inductance L2, and one end of the inductor 3b is connected between the connection point between the output terminal To and the other end of the inductor 2. In addition, a resonance frequency fr2 of the serial resonance circuit 32f is represented by the following equation.

[Equation 19]

$$fr2 = \frac{1}{2\pi\sqrt{L2 \times C2a}} \quad (19)$$

Each of the high frequency filter shown in FIG. 21 and a high frequency filter according to the prior art is employed to pass therethrough the digital television broadcasting signals fallen within the frequency band of 470 MHz to 770 MHz. Further, each of the high frequency filter shown in FIG. 21 and the high frequency filter according to the prior art is a low-pass filter for passing therethrough signals having frequencies equal to or lower than 770 MHz by the inductor 2. Further, the low-pass filter has an attenuation pole having an attenuation pole frequency f1 which is equal to the resonance frequency fr1, and an attenuation pole having an attenuation pole frequency f2 which is equal to the resonance frequency fr2. Out of the two attenuation pole frequencies f1 and f2, the attenuation pole frequency closer to a pass band of the low-pass filter is set to the resonance frequency fr1 and the other attenuation pole frequency is set to the resonance frequency fr2. Concretely speaking, the attenuation pole frequencies f1 and f2 satisfy the following equation.

[Equation 20]

$$f1 < f2 \quad (20)$$

Further, in the high frequency filter according to the present embodiment, the inductances L1 and L2 and the capacitances C1a and C2a are set so as to satisfy the following equation.

[Equation 21]

$$\frac{L1}{C1a} > \frac{L2}{C2a} \quad (21)$$

Figure 22:
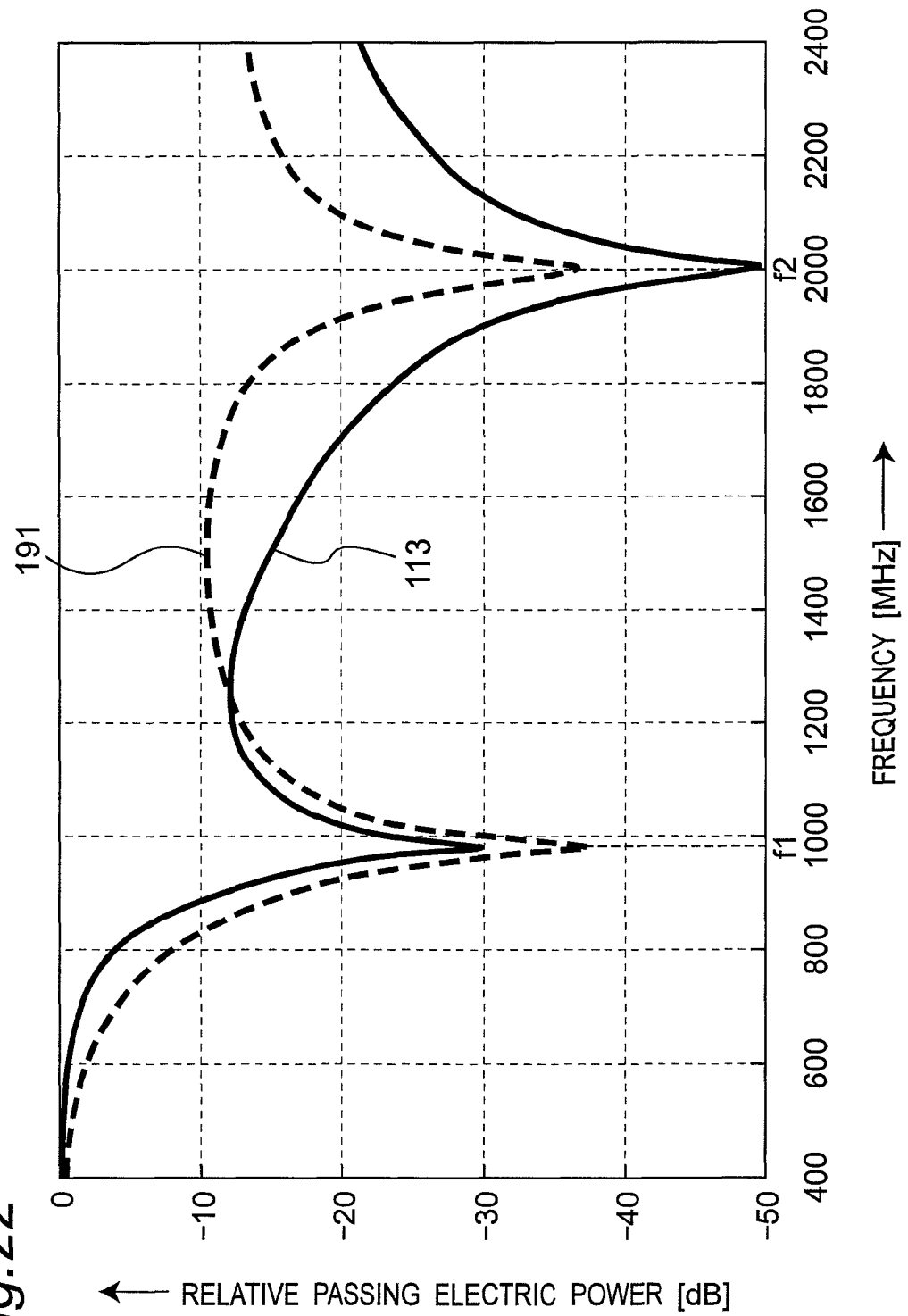
FIG. 22 is a graph showing a relationship between a frequency and a relative passing electric power of the high frequency filter shown in FIG. 21, and a relationship between a frequency and a relative passing electric power of the high frequency filter according to the prior art.

FIG. 22 is a graph showing a relationship between a frequency and a relative passing electric power of the high frequency filter shown in FIG. 21, and a relationship between a frequency and a relative passing electric power of the high frequency filter according to the prior art. Referring to FIG. 22, a characteristic 113 shows the relationship between the frequency and relative passing electric power of the high frequency filter shown in FIG. 21 when the inductance Ls of the inductor 2 is set to 18.0 nH, the inductance L1 of the inductor 3a is set to 13.2 nH, the capacitance C1a of the capacitor 4a is set to 2.0 pF, the inductance L2 of the inductor 3b is set to 3.0 nH, and the capacitance C2a of the capacitor 4b is set to 2.1 pF. In the characteristic 113, the attenuation pole frequency f1 is set to about 980 MHz and the attenuation pole frequency f2 is set to about 2000 MHz. In addition, a value of L1/C1a is set to 6.6, and a value of L2/C2a is set to 1.43.

In addition, in FIG. 22, a characteristic 191 shows the relationship between the frequency of the high frequency filter according to the prior art and relative passing electric power when the inductance Ls of the inductor 2 is set to 18.0 nH, the inductance L1 of the inductor 3a is set to 8.0 nH, the capacitance C1a of the capacitor 4a is set to 3.3 pF, the inductance L2 of the inductor 3b is set to 15.0 nH, and the capacitance C2a of the capacitor 4b is set to 0.42 pF. In the high frequency filter according to the prior art, the inductances L1 and L2 and the capacitances C1a and C2a are set so that attenuation pole frequencies are equal to the attenuation pole frequencies f1 and f2 of the high frequency filter according to the present embodiment, respectively, and so as to satisfy the following equation.

[Equation 22]

$$\frac{L1}{C1a} < \frac{L2}{C2a} \quad (22)$$

In the characteristic 191 shown in FIG. 22, the value of L1/C1a is set to 2.42, and the value of L2/C2a is set to 35.7.

As apparent from FIG. 22, in the high frequency filter according to the eighth embodiment, a pass band of frequencies equal to or lower than 770 MHz and a stop band of frequencies higher than 770 MHz are formed using the two attenuation poles. In the high frequency filter according to the present embodiment shown in FIG. 21, the inductances L1 and L2 and the capacitances C1a and C2a are set to satisfy the equations (20) and (21). Therefore, a width of the attenuation pole closer to the pass band of frequencies equal to or lower than 770 MHz is smaller than that of the attenuation pole farther from the pass band. Further, as compared with the high frequency filter according to the prior art, the relative passing electric power is high in the pass band and an attenuation amount is large in the stop band of frequencies higher than 770 MHz.

Figure 23:
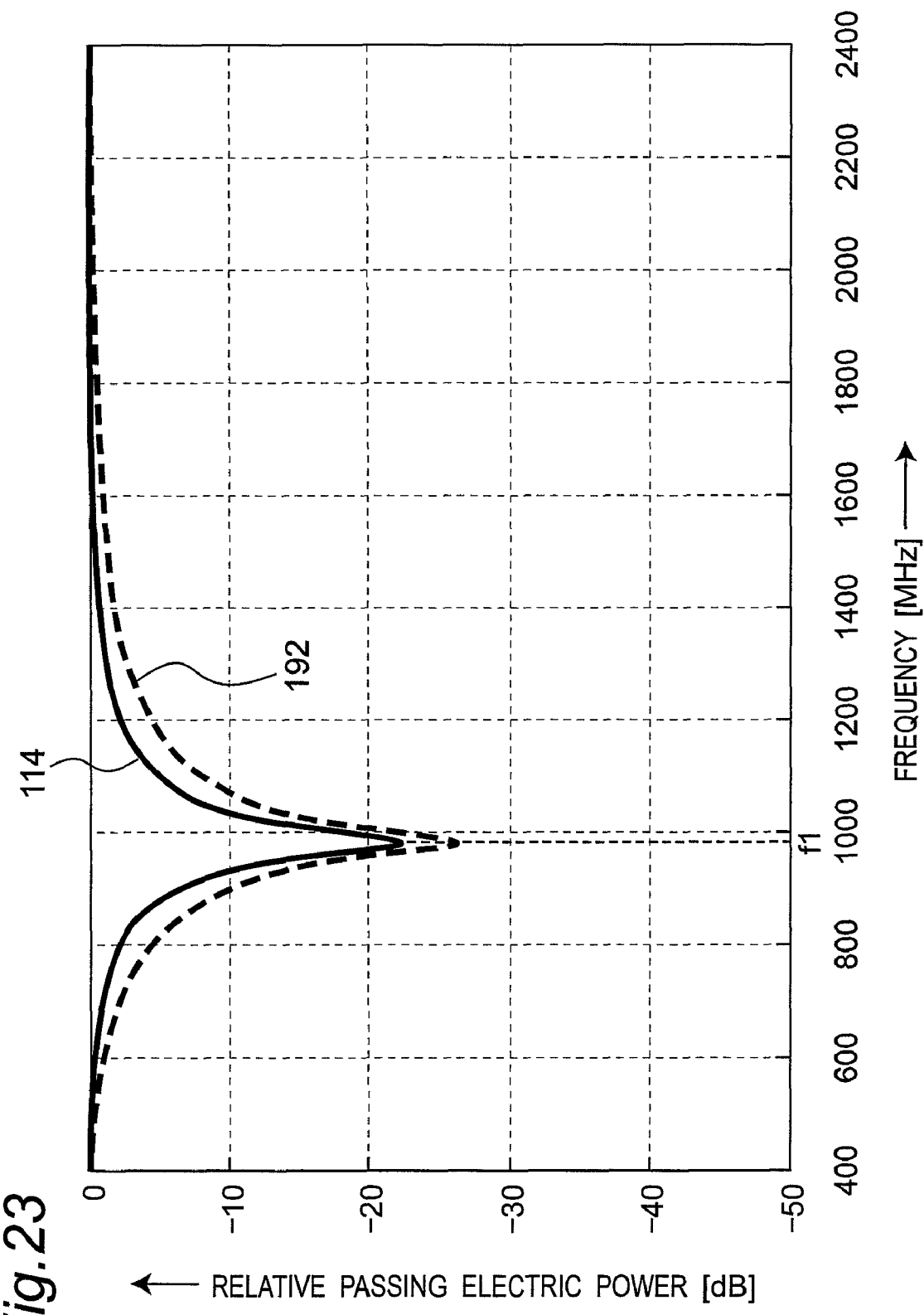
FIG. 23 is a graph showing a relationship between a frequency and a relative passing electric power of a circuit obtained by eliminating a serial resonance circuit 32f from the high frequency filter shown in FIG. 21.

FIG. 23 is a graph showing a relationship between a frequency and a relative passing electric power of a circuit obtained by eliminating the serial resonance circuit 32f from the high frequency filter shown in FIG. 21. Referring to FIG. 23, a characteristic 114 shows the relationship between the frequency and the relative passing electric power when the values of the elements of the above-mentioned circuit are set equal to those of the elements set in the characteristic 113 shown in FIG. 22, respectively. In addition, a characteristic 192 shows the relationship between the frequency and the relative passing electric power when the values of the elements of the circuit are set equal to those of the elements set in the characteristic 191 shown in FIG. 22, respectively. As apparent from FIG. 23, the relative passing electric power of the characteristic 114 at the attenuation pole frequency f1 is higher than that of the characteristic 192 at the attenuation pole frequency f1. However, the relative passing electric power of the characteristic 114 at the pass band of frequencies equal to or lower than 770 MHz is larger than that of the relative passing electric power of the high frequency filter having the characteristic 192 at the pass band of frequencies equal to or lower than 770 MHz. Namely, the power loss in the pass band of frequencies equal to or lower than 770 MHz of the high frequency filter according to the present embodiment is lower than that of the high frequency filter according to the prior art.

Figure 24:
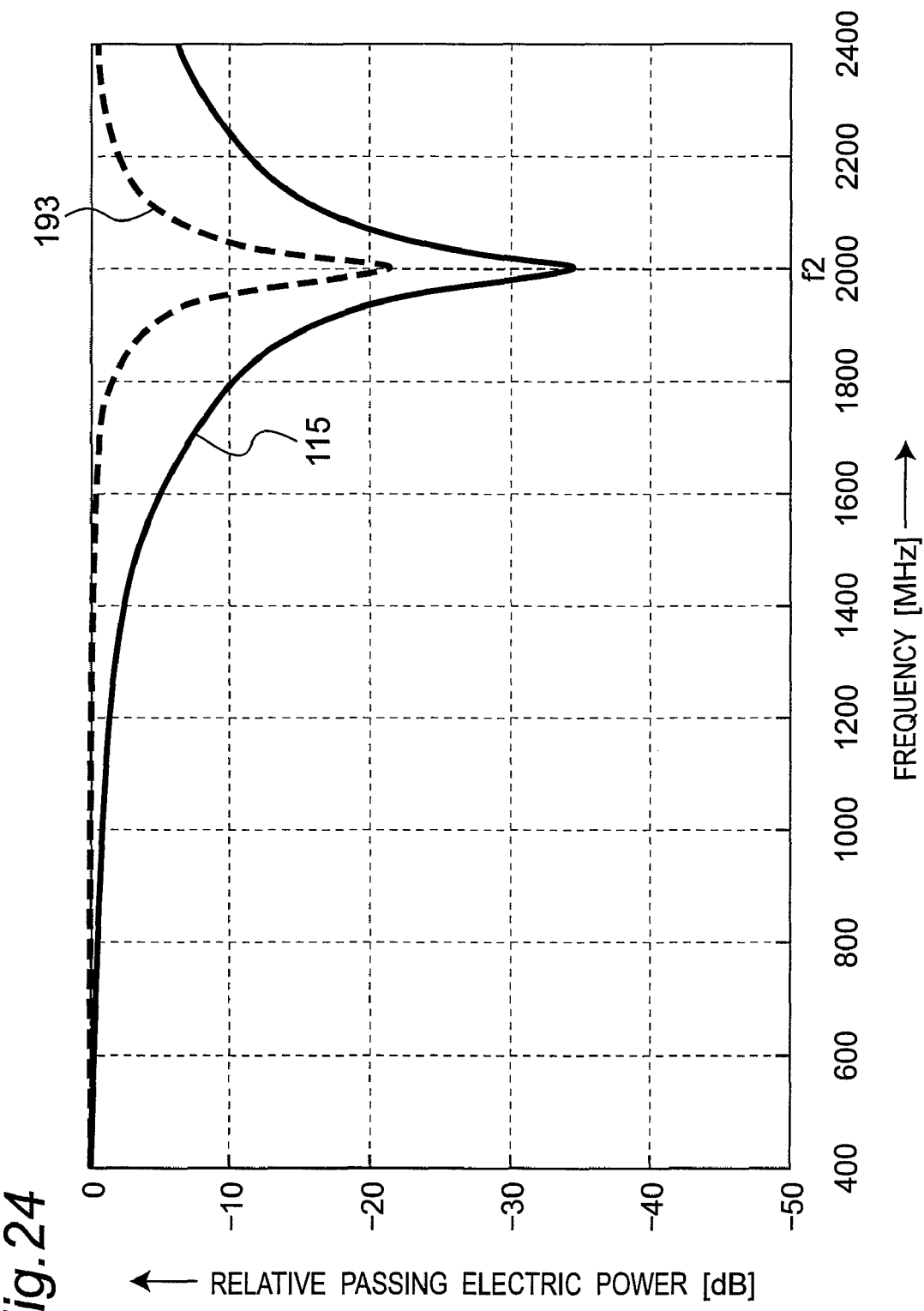
FIG. 24 is a graph showing a relationship between a frequency and a relative passing electric power of a circuit obtained by eliminating a serial resonance circuit 31f from the high frequency filter shown in FIG. 21.

FIG. 24 is a graph showing a relationship between a frequency and a relative passing electric power of a circuit obtained by eliminating the serial resonance circuit 31f from the high frequency filter shown in FIG. 21. Referring to FIG. 24, a characteristic 115 shows the relationship between the frequency and the relative passing electric power when the values of the elements of the above-mentioned circuit are set equal to those of the elements set in the characteristic 113 shown in FIG. 22, respectively. In addition, a characteristic 193 shows the relationship between the frequency and the relative passing electric power when the values of the elements of the circuit are set equal to those of the elements set in the characteristic 191 shown in FIG. 22, respectively. As apparent from FIG. 24, the relative passing electric power of the characteristic 115 at the attenuation pole frequency f2 is lower than that of the characteristic 193 at the attenuation pole frequency f2. Further, a width of the attenuation pole having the attenuation pole frequency f2 of the characteristic 115 is larger than that of the attenuation pole having the attenuation pole frequency f2 of the characteristic 193. Namely, the attenuation amount in the stop band of frequencies higher than 770 MHz of the high frequency filter according to the present embodiment is larger than that of the high frequency filter according to the prior art. In addition, the characteristics 115 and 193 are almost equal in the relative passing electric power in the pass band of frequencies equal to or lower than 770 MHz.

It is to be noted that the concrete example of the settings of the inductances Ls, L1, and L2 and the capacitances C1a and C2a are only example, and that the present invention is not limited to this. The inductances Ls, L1, and L2 and the capacitances C1a and C2a may be set to the values satisfying both of the equations (20) and (21), respectively. As mentioned above, the desired attenuation amount at the frequency at which the signals are to be attenuated changes depending on the desired channels of the digital television broadcasting. Therefore, the inductances Ls, L1, and L2 and the capacitances C1a and C2a may be set so as to satisfy the equations (20) and (21), and so as to be able to obtain attenuation amounts substantially equal to the desired attenuation amounts near the respective attenuation poles. For example, in FIG. 22, the inductances Ls, L1, and L2 and the capacitances C1a and C2a may be set, so that a bandwidth, in which the relative passing electric power equal to or lower than, for example, −30 dB, becomes wider when an attenuation amount equal to or larger than the desired attenuation amount in the vicinity of the attenuation pole having the attenuation pole frequency f2 is to be obtained. This leads to a reduced power loss in the pass band.

Further, in FIG. 21, the inductor 3a and the capacitor 4a may be replaced by each other and connected in the serial resonance circuit 31f, and the inductor 3b and the capacitor 4b may be replaced by each other and connected in the serial resonance circuit 32f.

Ninth Embodiment

Figure 25:
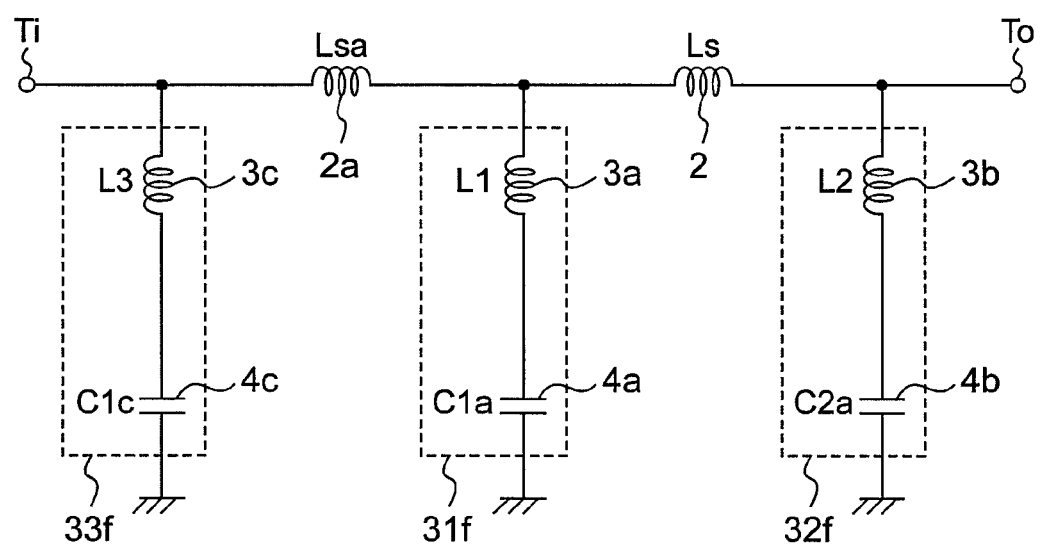
FIG. 25 is a circuit diagram of a high frequency filter according to a ninth embodiment of the present invention.

FIG. 25 is a circuit diagram of a high frequency filter according to a ninth embodiment of the present invention. Referring to FIG. 25, the high frequency filter according to the ninth embodiment is constituted by including the inductors 2a and 2 connected in series between the input terminal Ti and the output terminal To, a serial resonance circuit 33f connected between a connection point between the input terminal Ti and one end of the inductor 2a and the ground, a serial resonance circuit 31f connected between a connection point between the other end of the inductor 2a and one end of the inductor 2 and the ground, and a serial resonance circuit 32f connected between a connection point between the other end of the inductor 2 and the output terminal To and the ground. In this case, the serial resonance circuit 33f includes the capacitor 4c having the capacitance C3a and the inductor 3c having the inductance L3, and one end of the inductor 3c is connected to the connection point between the input terminal Ti and one end of the inductor 2a.

As compared with the high frequency filter according to the eighth embodiment, the high frequency filter according to the ninth embodiment is characterized by further including the inductor 2a and the serial resonance circuit 33f. In this case, the inductance L3 and the capacitance C3a are set so that a resonance frequency of the serial resonance circuit 33f is substantially equal to the resonance frequency fr1 of the serial resonance circuit 31f, and so that a value of L3/C3a is larger than the value of L2/C2a.

Figure 26:
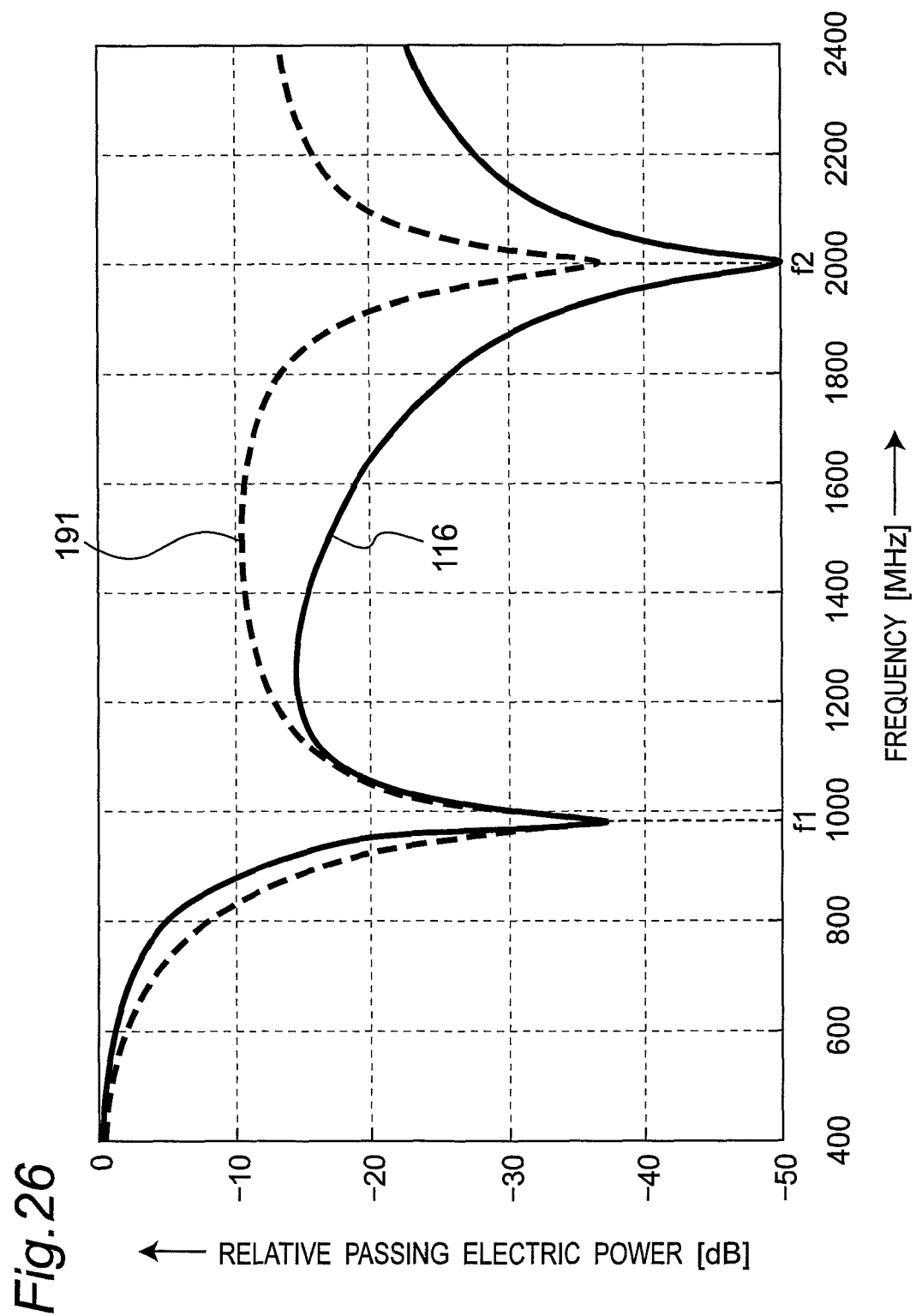
FIG. 26 is a graph showing a relationship between a frequency and a relative passing electric power of the high frequency filter shown in FIG. 25, and a relationship between a frequency and a relative passing electric power of the high frequency filter according to the prior art.

FIG. 26 is a graph showing a relationship between a frequency and a relative passing electric power of the high frequency filter shown in FIG. 25, and a relationship between a frequency and a relative passing electric power of the high frequency filter according to the prior art. Referring to FIG. 26, a characteristic 116 shows the relationship between the frequency and the relative passing electric power of the high frequency filter shown in FIG. 21 when the inductance Ls of the inductor 2 is set to 18.0 nH, an inductance Lsa of the inductor 2a is set to 1.5 nH, the inductances L1 and L3 of the inductors 3a and 3c are set to 22.0 nH, respectively, capacitances C1a and C1c of the capacitors 4a and 4c are set to 1.2 pF, respectively, the inductance L2 of the inductor 3b is set to 3.0 nH, and the capacitance C2a of the capacitor 4b is set to 2.1 pF. In the characteristic 116, an attenuation pole frequency f1 is set to about 980 MHz, and an attenuation pole frequency f2 is set to about 2000 MHz. Further, each of the value of L1/C1a and the value of L3/C3a is set to 18.3, and the value of L2/C2a is set to 1.43. A characteristic 191 shown in FIG. 26 is similar to the characteristic 191 show in FIG. 22.

The high frequency filter according to the ninth embodiment further includes the serial resonance circuit 33f having the resonance frequency equal to the attenuation pole frequency f1 (See FIG. 22), as compared with the high frequency filter according to the eighth embodiment. Therefore, as apparent from FIG. 26, the attenuation amount at the attenuation pole frequency f1 of the high frequency filter according to the ninth embodiment is larger than that of the high frequency filter according to the eighth embodiment, and the attenuation amount at the stop band of frequencies higher than 770 MHz is larger than that of the high frequency filter according to the eighth embodiment. In addition, the power loss in the pass band of frequencies equal to or lower than 770 MHz of the high frequency filter according to the ninth embodiment is smaller than that of the prior art.

In the characteristic 116 shown in FIG. 26, the inductance L3 and the capacitance C3a are set so that the resonance frequency of the serial resonance circuit 33f is equal to the resonance frequency fr1 of the serial resonance circuit 31f. However, the present invention is not limited to this. The inductance L3 and the capacitance C3a may be set so that the resonance frequency of the serial resonance circuit 33f is substantially equal to the resonance frequency fr1 of the serial resonance circuit 31f.

In addition, in FIG. 25, the inductor 3a and the capacitor 4a may be replaced by each other and connected in the serial resonance circuit 31f, and the inductor 3b and the capacitor 4b may be replaced by each other and connected in the serial resonance circuit 32f. Further, the inductor 3c and the capacitor 4c may be replaced by each other and connected in the serial resonance circuit 33f.

Tenth Embodiment

Figure 27:
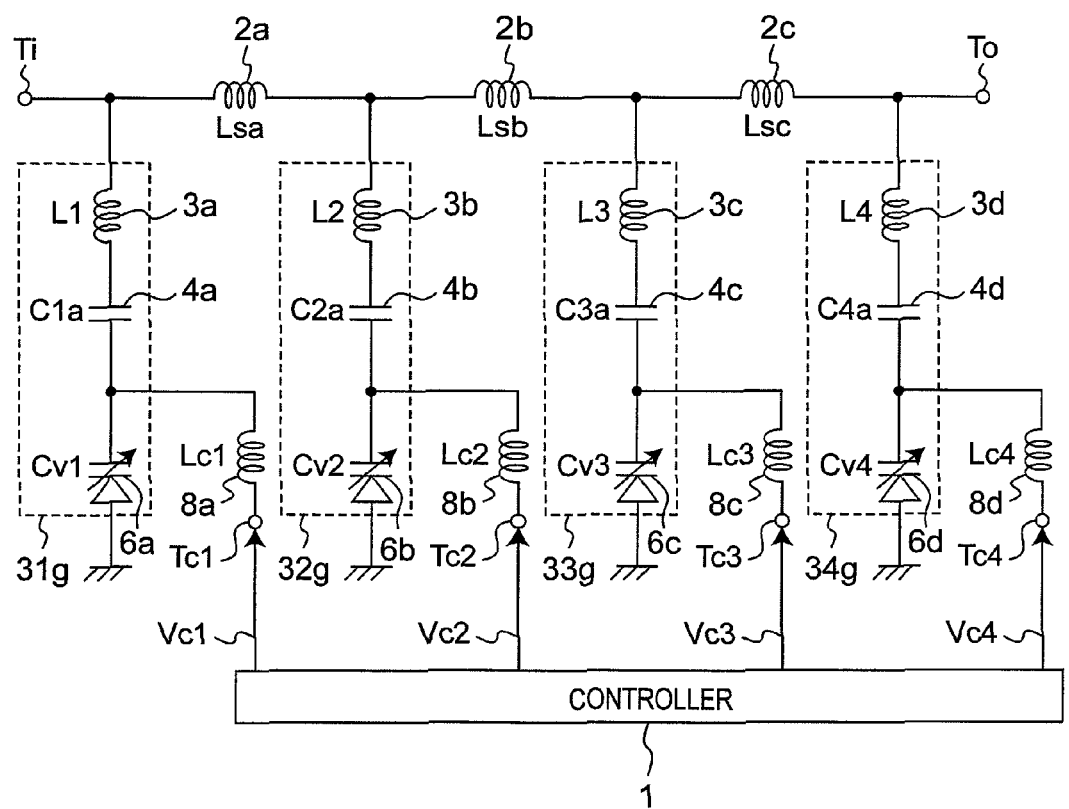
FIG. 27 is a circuit diagram of a variable-frequency high frequency filter according to a tenth embodiment of the present invention.

FIG. 27 is a circuit diagram of a variable-frequency high frequency filter according to a tenth embodiment of the present invention. Referring to FIG. 27, the high frequency filter according to the tenth embodiment is constituted by including the controller 1, inductors 2a, 2b, and 2c connected in series between the input terminal Ti and the output terminal To, a serial resonance circuit 31g connected between a connection point between the input terminal Ti and one end of the inductor 2a and the ground, a serial resonance circuit 32g connected between a connection point between the other end of the inductor 2a and one end of the inductor 2b and the ground, a serial resonance circuit 33g connected between a connection point between the other end of the inductor 2b and one end of the inductor 2c and the ground, and a serial resonance circuit 34g connected between a connection point between the other end of the inductor 2c and the output terminal To and the ground, and high frequency blocking choke coils 8a, 8b, 8c, and 8d.

In this case, in FIG. 27, the serial resonance circuit 31g is a circuit in which the inductor 3a having the inductance L1, the capacitor 4a having the capacitance C1a, and a varactor diode 6a having a capacitance Cv1 are connected in series in this order. An anode of the varactor diode 6a is grounded and a cathode thereof is connected to a control terminal Tc1 via the choke coil 8a. A resonance frequency frv1 of the serial resonance circuit 31g is an attenuation pole frequency fpv1 of the high frequency filter shown in FIG. 27, and it is represented by the following equation, using the inductance L1 and a capacitance C1g, which is a combined capacitance of the capacitor 4a and the varactor diode 6a.

[Equation 23]

$$frv1 = fpv1 = \frac{1}{2\pi\sqrt{L1 \times C1g}} \quad (23)$$

In this case, the capacitance C1g is represented by the following equation.

[Equation 24]

$$C1g = \frac{C1a \times Cv1}{C1a + Cv1} \quad (24)$$

Further, the serial resonance circuit 32g is a circuit in which the inductor 3b having the inductance L2, the capacitor 4b having the capacitance C2a, and a varactor diode 6b having a capacitance Cv2 are connected in series in this order. An anode of the varactor diode 6b is grounded while a cathode thereof is connected to a control terminal Tc2 via the choke coil 8b. A resonance frequency frv2 of the serial resonance circuit 32g is an attenuation pole frequency fpv2 of the high frequency filter shown in FIG. 27, and it is represented by the following equation, using the inductance L2 and a capacitance C2g, which is a combined capacitance of the capacitor 4b and the varactor diode 6b.

[Equation 25]

$$frv2 = fpv2 = \frac{1}{2\pi\sqrt{L2 \times C2g}} \quad (25)$$

In this case, the capacitance C2g is represented by the following equation.

[Equation 26]

$$C2g = \frac{C2a \times Cv2}{C2a + Cv2} \quad (26)$$

Further, the serial resonance circuit 33g is a circuit in which the inductor 3c having the inductance L3, the capacitor 4c having the capacitance C3a, and a varactor diode 6c having a capacitance Cv3 are connected in series in this order. An anode of the varactor diode 6c is grounded while a cathode thereof is connected to a control terminal Tc3 via the choke coil 8c. A resonance frequency frv3 of the serial resonance circuit 33g is an attenuation pole frequency fpv3 of the high frequency filter shown in FIG. 27, and it is represented by the following equation, using the inductance L3 and a capacitance C3g, which is a combined capacitance of the capacitor 4c and the varactor diode 6c.

[Equation 27]

$$frv3 = fpv3 = \frac{1}{2\pi\sqrt{L3 \times C3g}} \quad (27)$$

In this case, the capacitance C3g is represented by the following equation.

[Equation 28]

$$C3g = \frac{C3a \times Cv3}{C3a + Cv3} \quad (28)$$

Still further, the serial resonance circuit 34g is a circuit in which an inductor 3d having an inductance L4, a capacitor 4d having a capacitance C4a, and a varactor diode 6d having a capacitance Cv4 are connected in series in this order. An anode of the varactor diode 6d is grounded while a cathode thereof is connected to a control terminal Tc4 via the choke coil 8d. A resonance frequency frv4 of the serial resonance circuit 34g is an attenuation pole frequency fpv4 of the high frequency filter shown in FIG. 27, and it is represented by the following equation, using the inductance L4 and a capacitance C4g, which is a combined capacitance of the capacitor 4d and the varactor diode 6d.

[Equation 29]

$$frv4 = fpv4 = \frac{1}{2\pi\sqrt{L4 \times C4g}} \quad (29)$$

In this case, the capacitance C4g is represented by the following equation.

[Equation 30]

$$C4g = \frac{C4a \times Cv4}{C4a + Cv4} \quad (30)$$

In this case, the high frequency filter shown in FIG. 27 is employed to pass therethrough the digital television broadcasting signals fallen within the frequency band of 470 MHz to 770 MHz. In addition, the high frequency filter shown in FIG. 27 is a low-pass filter for passing therethrough signals having frequencies equal to or lower than 770 MHz by the inductors 2a, 2b, and 2c. Further, the low-pass filter has four attenuation poles having the attenuation pole frequencies fpv1, fpv2, fpv3, and fpv4, respectively. It is to be noted that, from the attenuation pole closest to the pass band of the low-pass filter toward the attenuation pole having the higher frequency in order, the attenuation pole frequencies of the attenuation poles are set to the frequencies fpv1, fpv2, fpv3, and fpv4, respectively. Namely, the attenuation pole frequencies fpv1, fpv2, fpv3, and fpv4 satisfy the following equation.

[Equation 31]

$$fpv1 < fpv2 < fpv3 < fpv4 \quad (31)$$

The controller 1 changes reverse bias voltages applied to the varactor diodes 6a, 6b, 6c, and 6c by changing DC voltages Vc1, Vc2, Vc3, and Vc4 applied to the control terminals Tc11, Tc2, Tc3, and Tc4, respectively, so as to satisfy the following equation.

[Equation 32]

$$\frac{L1}{C1g} > \frac{L2}{C2g} > \frac{L3}{C3g} > \frac{L4}{C4g} \quad (32)$$

Thus, the controller 1 changes the attenuation pole frequencies fpv1, fpv2, fpv3, and fpv4 of the high frequency filter shown in FIG. 27 by changing the capacitances Cv1, Cv2, Cv3, and Cv4 of the varactor diodes 6a, 6b, 6c, and 6c, respectively.

It is to be noted that each of the capacitors 4a, 4b, 4c, and 4d is a low frequency blocking capacitor provided to prevent the DC components of the DC voltages Vc1, Vc2, Vc3, and Vc4 from leaking to the input terminal Ti and the output terminal To.

Figure 28:
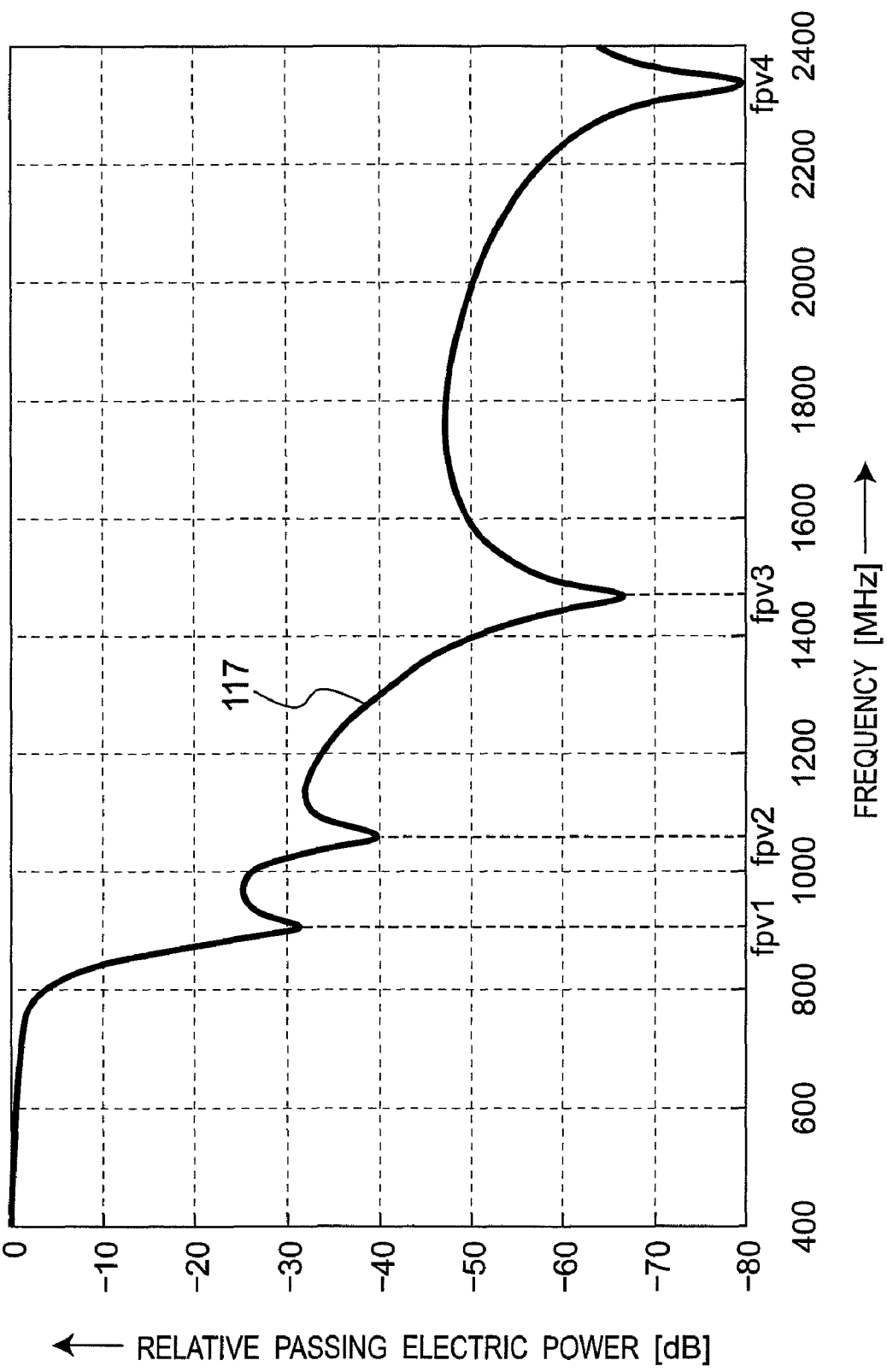
FIG. 28 is a graph showing a relationship between a frequency and a relative passing electric power of the high frequency filter shown in FIG. 27.

FIG. 28 is a graph showing a relationship between a frequency and a relative passing electric power of the high frequency filter shown in FIG. 27. Referring to FIG. 28, a characteristic 117 shows the relationship between the frequency and the relative passing electric power of the high frequency filter shown in FIG. 27 when values of respective components of the high frequency filter shown in FIG. 27 are set as follows. Namely, an inductance Lsa of the inductor 2a is set to 10.63 nH, an inductance Lsb of the inductor 2b is set to 7.03 nH, and an inductance Lsc of the inductor 2c is set to 9.02 nH. In addition, the inductance L1 of the inductor 3a is set to 18.98 nH, the capacitance C1a of the capacitor 4a is set to 3.26 pF, the inductance L2 of the inductor 3b is set to 5.59 nH, the capacitance C2a of the capacitor 4b is set to 8.11 pF, the inductance L3 of the inductor 3c is set to 3.22 nH, the capacitance C3a of the capacitor 4c is set to 7.32 pF, and the inductance L4 of the inductor 3d is set to 1.32 nH, and the capacitance C4a of the capacitor 4d is set to 7.08 pF. In addition, the DC voltages Vc1, Vc2, Vc3, and Vc4 are set so that the capacitances Cv1, Cv2, Cv3, and Cv4 of the varactor diodes 6a, 6b, 6c, and 6d are set to 3.26 pF, 8.11 pF, 7.32 pF, and 7.08 pF, respectively.

As apparent from FIG. 28, in the high frequency filter according to the tenth embodiment, the pass band of frequencies equal to or lower than 770 MHz and the stop band of frequencies higher than 770 MHz are formed using the four attenuation poles. Further, in the high frequency filter according to the tenth embodiment, the inductances of the inductors L1, L2, L3, and L4, the capacitances of the capacitors C1a, C2a, C3a, and C4a, and the capacitances of the varactor diodes 6a, 6b, 6c, and 6d are set so as to satisfy the equations (31) and (32), and a width of the attenuation pole closer to the pass band is set smaller than that of the attenuation pole farther from the pass band. Therefore, as compared with the prior art, the high frequency filter according to the tenth embodiment can obtain a large attenuation amount over a wide frequency band in the stop band without reducing the relative passing electric power in the pass band.

Further, since each of the serial resonance circuits 31g, 32g, 33g, and 34g includes the inductor, the capacitor, and the varactor diode, the attenuation pole frequencies fpv1, fpv2, fpv3, and fpv4 of the high frequency filter shown in FIG. 27 can be changed, respectively. Therefore, the attenuation pole frequencies fpv1, fpv2, fpv3, and fpv4 can be changed depending on the desired channels of the digital television broadcasting inputted from the input terminal Ti.

In the present embodiment, the inductances of the inductors 3a, 3b, 3c, and 3d, the capacitances of the capacitors 4a, 4b, 4c, and 4d, and the capacitances of the varactor diodes 6a, 6b, 6c, and 6d are set to satisfy the equations (31) and (32). However, the present invention is not limited to this. In a low-pass filter having a predetermined pass band, when two arbitrary attenuation pole frequencies fcx and fcy satisfy fcx<fcy, an inductance Lx of an inductor and a capacitance Cx of a capacitor each included in a serial resonance circuit having the resonance frequency fcx, and an inductance Ly of an inductor and a capacitance Cy of a capacitor each included in a serial resonance circuit having the resonance frequency fcy may be set to satisfy Lx/Cx>Ly/Cy.

Eleventh Embodiment

Figure 29:
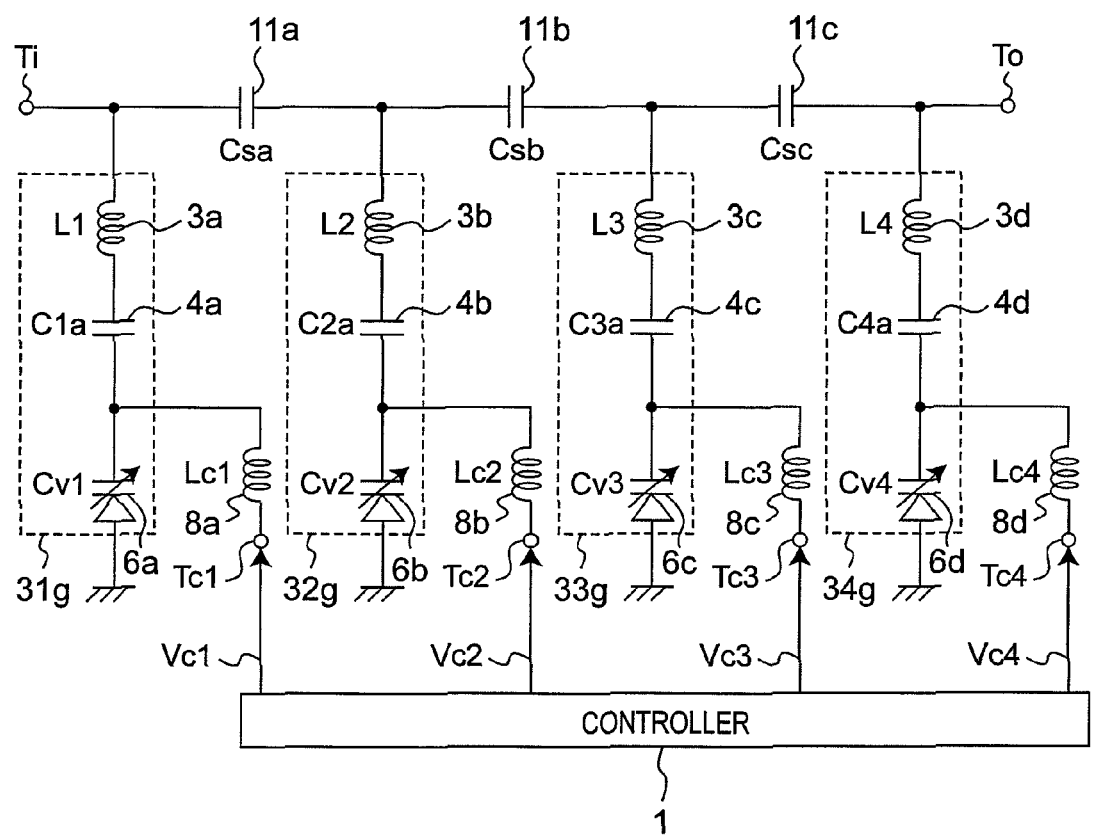
FIG. 29 is a circuit diagram of a variable-frequency high frequency filter according to an eleventh embodiment of the present invention.

FIG. 29 is a circuit diagram of a variable-frequency high frequency filter according to an eleventh embodiment of the present invention. Referring to FIG. 29, as compared with the high frequency filter according to the tenth embodiment shown in FIG. 27, the high frequency filter according to the eleventh embodiment is characterized by replacing the inductors 2a, 2b, and 2c by the capacitors 11a, 11b, and 11c, respectively.

In this case, the high frequency filter shown in FIG. 29 is a high-pass filter passing therethrough signals having frequencies equal to or higher than 1400 MHz by the capacitors 11a, 11b, and 11c. Further, the high-pass filter has four attenuation poles having attenuation pole frequencies fpv1, fpv2, fpv3, and fpv4, respectively. It is to be noted that the attenuation pole frequencies of the attenuation poles are set to the frequencies fpv1, fpv2, fpv3, and fpv4, respectively, in an order from the attenuation pole closest to the pass band of the high-pass filter toward the attenuation pole having the lower frequency. Namely, the attenuation pole frequencies fpv1, fpv2, fpv3, and fpv4 satisfy the following equation.

[Equation 33]

$$fpv1 > fpv2 > fpv3 > fpv4 \quad (33)$$

The controller 1 changes the reverse bias voltages applied to the varactor diodes 6a, 6b, 6c, and 6c by changing the DC voltages Vc1, Vc2, Vc3, and Vc4 applied to the control terminals Tc11, Tc2, Tc3, and Tc4, respectively, so as to satisfy the following equation.

[Equation 34]

$$\frac{L1}{C1g} > \frac{L2}{C2g} > \frac{L3}{C3g} > \frac{L4}{C4g} \quad (34)$$

Thus, the controller 1 changes the attenuation pole frequencies fpv1, fpv2, fpv3, and fpv4 of the high frequency filter shown in FIG. 29 by changing the capacitances Cv1, Cv2, Cv3, and Cv4 of the varactor diodes 6a, 6b, 6c, and 6c, respectively.

Figure 30:
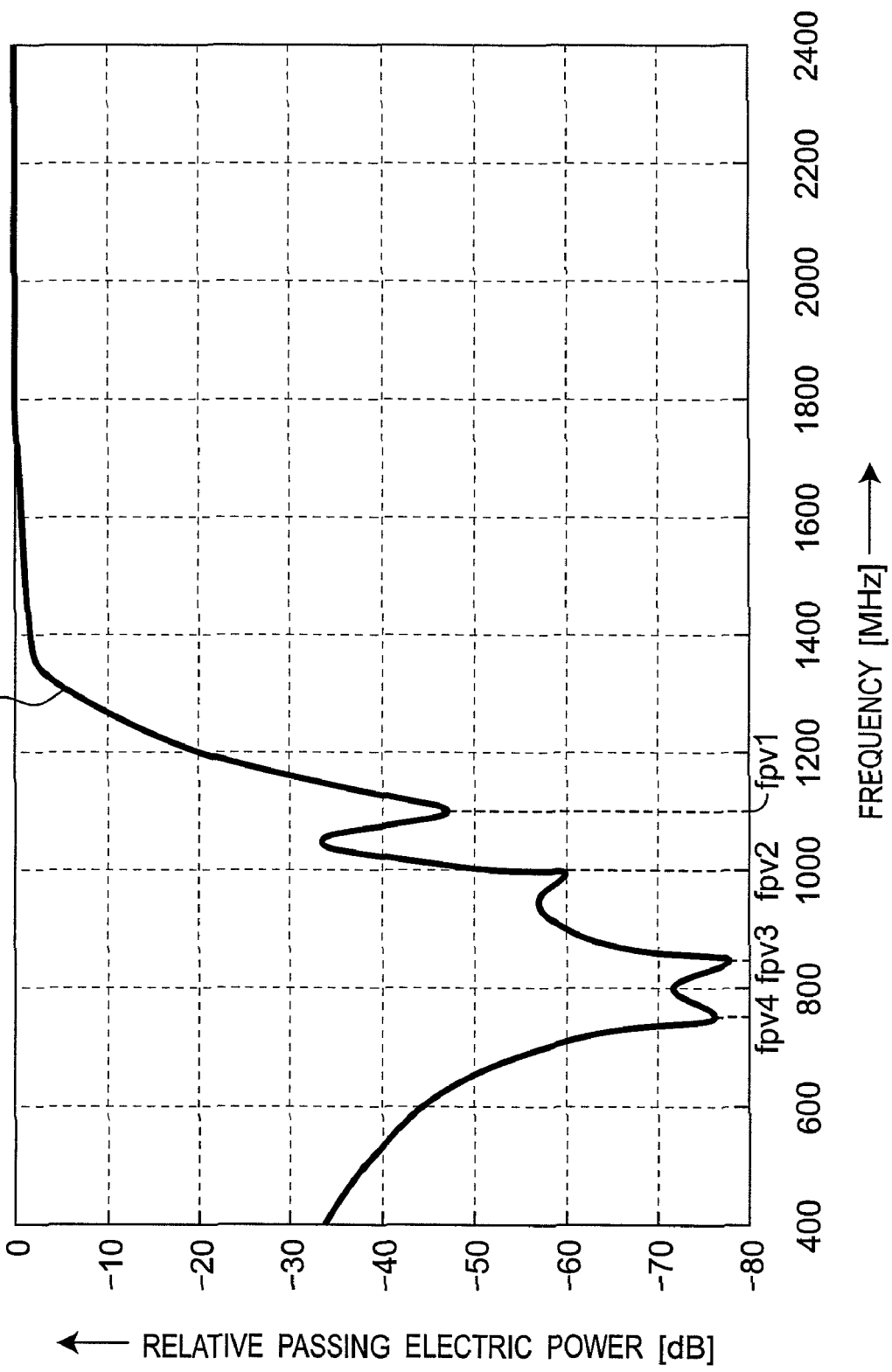
FIG. 30 is a graph showing a relationship between a frequency and a relative passing electric power of the high frequency filter shown in FIG. 29.

FIG. 30 is a graph showing a relationship between a frequency and a relative passing electric power of the high frequency filter shown in FIG. 29. Referring to FIG. 30, a characteristic 118 shows the relationship between the frequency and the relative passing electric power of the high frequency filter shown in FIG. 29 when values of respective components of the high frequency filter shown in FIG. 29 are set as follows. Namely, the capacitance Csa of the capacitor 11a is set to 3.00 pF, the capacitance Csb of the capacitor 11b is set to 9.00 pF, and the capacitance Csc of the capacitor 11c is set to 3.00 pF. Further, the inductance L1 of the inductor 3a is set to 6.00 nH, the capacitance C1a of the capacitor 4a is set to 1.75 pF, the inductance L2 of the inductor 3b is set to 6.50 nH, the capacitance C2a of the capacitor 4b is set to 2.00 pF, the inductance L3 of the inductor 3c is set to 4.00 nH, the capacitance C3a of the capacitor 4c is set to 4.50 pF, the inductance L4 of the inductor 3d is set to 4.00 nH, and the capacitance C4a of the capacitor 4d is set to 5.00 pF. In addition, the DC voltages Vc1, Vc2, Vc3, and Vc4 are set so that the capacitances Cv1, Cv2, Cv3, and Cv4 of the varactor diodes 6a, 6b, 6c, and 6d are set to 1.75 pF, 2.00 pF, 4.50 pF, and 5.00 pF, respectively.

As apparent from FIG. 30, in the high frequency filter according to the eleventh embodiment, the stop band of frequencies lower than 1400 MHz is formed using the four attenuation poles. Further, in the high frequency filter according to the eleventh embodiment, the inductances of the inductors L1, L2, L3, and L4, the capacitances of the capacitors C1a, C2a, C3a, and C4a, and the capacitances of the varactor diodes 6a, 6b, 6c, and 6d are set to satisfy the equations (33) and (34), and a width of the attenuation pole closer to the pass band is set smaller than that of the attenuation pole farther from the pass band. Therefore, as compared with the prior art, the high frequency filter according to the eleventh embodiment can obtain a large attenuation amount over a wide frequency band in the stop band without reducing the relative passing electric power in the pass band.

Further, since each of the serial resonance circuits 31g, 32g, 33g, and 34g includes the inductor, the capacitor, and the varactor diode, the attenuation pole frequencies fpv1, fpv2, fpv3, and fpv4 of the high frequency filter shown in FIG. 29 can be changed, respectively. Therefore, the attenuation pole frequencies fpv1, fpv2, fpv3, and fpv4 can be changed depending on the desired channels of the digital television broadcasting inputted from the input terminal Ti.

In the present embodiment, the inductances of the inductors 3a, 3b, 3c, and 3d, the capacitances of the capacitors 4a, 4b, 4c, and 4d, and the capacitances of the varactor diodes 6a, 6b, 6c, and 6d are set to satisfy the equations (33) and (34). However, the present invention is not limited to this. In a high-pass filter having a predetermined pass band, when two arbitrary attenuation pole frequencies fcx and fcy satisfy fcx>fcy, an inductance Lx of an inductor and a capacitance Cx of a capacitor each included in a serial resonance circuit having the resonance frequency fcx, and an inductance Ly of an inductor and a capacitance Cy of a capacitor each included in a serial resonance circuit having the resonance frequency fcy may be set to satisfy Lx/Cx>Ly/Cy.

Twelfth Embodiment

Figure 31:
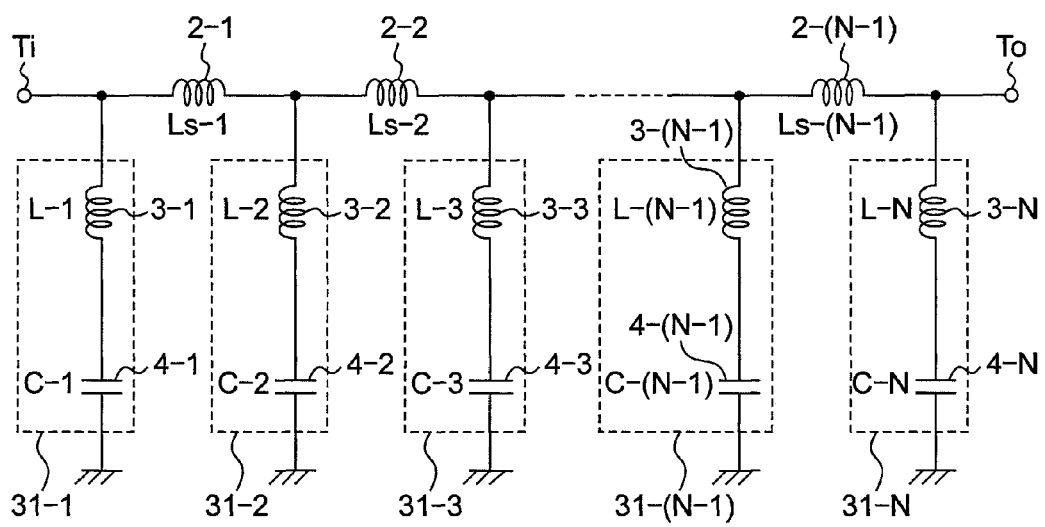
FIG. 31 is a circuit diagram of a high frequency filter according to a twelfth embodiment of the present invention.

FIG. 31 is a circuit diagram of a high frequency filter according to a twelfth embodiment of the present invention. Referring to FIG. 31, the high frequency filter according to the twelfth embodiment is constituted by including a plurality of (N−1) inductors 2-1, 2-2, ..., and 2-(N−1) connected in series between the input terminal Ti and the output terminal To, a serial resonance circuit 31-1 connected between a connection point between the input terminal Ti and one end of the inductor 2-1 and the ground, serial resonance circuits 31-n (n=2, 3, ..., N−1) each connected between a connection point between one end of the inductor 2-(n−1) and one end of the inductor 2-n and the ground, and a serial resonance circuit 31-N connected between a connection point between the other end of the inductor 2-(N−1) and the output terminal To and the ground. In this case, each of resonance frequencies frn of the plurality of N serial resonance circuits 31-n (n=1, 2, ..., N) is represented by the following equation, using an inductance L-n of the inductor 3-n and a capacitance C-n of the capacitor 4-n.

[Equation 35]

$$frn = \frac{1}{2\pi\sqrt{(L-n)\times(C-n)}} \quad (35)$$

The high frequency filter shown in FIG. 31 is a low-pass filter passing therethrough signals fallen within a predetermined pass band by the plurality of (N−1) inductors 2-1, 2-2, ..., and 2-(N−1). Further, the plurality of N resonance frequencies frn are attenuation pole frequencies fn of a plurality of N attenuation poles, respectively, and the pass band and the stop band of the low-pass filter are formed using the attenuation poles. It is to be noted that the attenuation pole frequencies of the attenuation poles are set to frequencies f1, f2, ..., and fN, respectively, in an order from the attenuation pole closest to the pass band of the low-pass filter toward the attenuation pole having the higher frequency. Namely, the attenuation pole frequencies f1, f2, ..., and fN satisfy the following equation.

[Equation 36]

$$f1 < f2 < ... < fN \quad (36)$$

Further, in the high frequency filter according to the present embodiment, inductances L-1, L-2, ..., and L-N and capacitances C-1, C-2, and C-N are set to satisfy the following equation.

[Equation 37]

$$\frac{L-1}{C-1} > \frac{L-2}{C-2} > ... > \frac{L-N}{C-N} \quad (37)$$

According to the high frequency filter according to the twelfth embodiment configured as described above, by setting the inductances L-1, L-2, ..., and L-N and capacitances C-1, C-2, ..., and C-N so as to satisfy the equations (36) and (37), a width of the attenuation pole closer to the pass band is set to be smaller than that of the attenuation pole farther from the pass band. Therefore, as compared with the prior art, the high frequency filter according to the twelfth embodiment can obtain a large attenuation amount over a wide frequency band in the stop band without reducing relative passing electric power in the pass band.

It is to be noted that, in the high frequency filter shown in FIG. 31, the inductor 3-n and the capacitor 4-n of the serial resonance circuit 31-n may be replaced by each other and connected.

Further, in FIG. 31, the inductors 2-1, 2-2, ..., and 2-n may be replaced by capacitors, respectively, to configure a high-pass filter for passing therethrough signals fallen within a predetermined pass band.

Thirteenth Embodiment

FIG. 32 is a block diagram showing a configuration of a wireless communication device according to a thirteenth embodiment of the present invention. Referring to FIG. 32, the wireless communication device according to the thirteenth embodiment is, for example, a direct sampling digital television broadcasting receiver for receiving the digital television broadcasting signals fallen within the frequency band of 470 MHz to 770 MHz. The digital television broadcasting receiver shown in FIG. 32 has an antenna 71, a filter 72 for inputting a wireless received signal received by the antenna, passing therethrough signals having frequencies of the desired channels, and attenuating signals having the other frequencies, a low-noise amplifier 73 for amplifying and outputting the signal from the filter 72, an analog-to-digital converter 74 for converting the signal from the low-noise amplifier 73 into a digital signal to be directly sampled and outputting the digital signal, and a decoding process circuit 75 for decoding the signal from the analog-to-digital converter 74 into a baseband signal and outputting the baseband signal.

In this case, in FIG. 32, the filter 72 is one of the high frequency filters according to the first to twelfth embodiments stated above. As mentioned above, the frequency at which signals are to be attenuated changes depending on the desired channels of the digital television broadcasting. Therefore, it is preferable to use one of the variable-frequency high frequency filters according to the first to seventh embodiments, tenth, and eleventh embodiments capable of changing the attenuation pole frequencies based on the desired channels.

Referring to FIG. 32, when the filter device 72 is the filter device according to one of the first to seventh embodiments, it is possible to provide the wireless communication device according to the present embodiment having the filter device smaller in size, lower in manufacturing cost, and capable of changing a plurality of attenuation pole frequencies, than that of the prior art. Further, when the filter device 72 is the filter device according to one of the eighth to twelfth embodiments, it is possible to provide the wireless communication device according to the present embodiment having the filter device lower in power loss in a pass band and larger in an attenuation amount in a stop band, as compared with the prior art.

It is to be noted that the high frequency filter according to each of the above-mentioned embodiments is smaller in size, lower in power loss in the pass band, and larger in the attenuation amount in the stop band, as compared with the prior art. Therefore, the high frequency filter according to each of the above-mentioned embodiments is useful as a filter device or the like for use in a wireless communication circuit implemented in a mobile body such as a mobile telephone, a portable electronic device mounting a wireless LAN (Local Area Network) or a portable digital television broadcasting receiving tuner. Further, the filter device according to the present invention can be applied to a filter device or the like employed in a wireless communication base station device according to specifications thereof.

In each of the above-mentioned embodiments, each of the varactor diodes 6, 6a, 6b, 6c, and 6d may be replaced by another variable capacitive element such as a parallel plate capacitor made of a thin film of a ferroelectric material such as barium strontium titanate ($Ba_xSr_{1-x}TiO_3$) having a capacitance changed by applying a DC bias voltage between both electrodes thereof. Further, when the varactor diode 6 or the like in which no current flows is used as a variable capacitive element, resistors may be used instead of the high frequency blocking choke coil 8, 8a, 8b, 8c or 8d in the respective embodiments described above.

Further, the high frequency filter according to each of the above-mentioned embodiments is a reciprocal circuit and the input terminal Ti and the output terminal To may be replaced by each other.

Further, a plurality of three or more attenuation pole frequencies may be controlled by using a plurality of variable-frequency high frequency filters according to each of the first to fifth embodiments.

INDUSTRIAL APPLICABILITY

As described above in detail, according to each of the filter devices according to the first and second aspects of the present invention and the wireless communication device having the filter device, the two attenuation pole frequencies of the filter device are changed by changing the capacitance of the one variable capacitive element. Therefore, the filter device has a smaller size and a lower manufacturing cost, than that of the filter device having the plurality of variable capacitive elements according to the prior art.

In addition, according to the filter device according to the third aspect of the present invention and the wireless communication device having the filter device, one of a first attenuation pole frequency and a second attenuation pole frequency closer to the pass band of the filter device is set to the first resonance frequency, and the other attenuation pole frequency is set to the second resonance frequency. In addition, the value obtained by dividing the first inductance by the first capacitance is larger than the value obtained by dividing the second inductance by the second capacitance. Therefore, as compared with the prior art, the power loss in the pass band is smaller, and the attenuation amount is larger in the stop band.

The invention claimed is:

1. A filter device comprising a first terminal and a second terminal, the filter device comprising:
   a reactance element connected between the first terminal and the second terminal;
   a first serial resonance circuit connected between a connection point connecting the first terminal and one end of the reactance element, and a ground, the first serial resonance circuit including a first inductor and at least one first capacitor connected in series via respective connection points for connecting the first inductor and at least one first capacitor;
   a second serial resonance circuit connected between a connection point connecting the second terminal and the other end of the reactance element, and the ground, the second serial resonance circuit including a second inductor and at least one second capacitor connected in series via respective connection points for connecting the second inductor and at least one second capacitor; and
   a third capacitor connected between one of the respective connection points of the first serial resonance circuit and one of the respective connection points of the second serial resonance circuit,
   wherein one of the first, second, and third capacitors is a variable capacitive element,
   wherein the variable capacitive element is connected to the first terminal via at least the first capacitor of the first serial resonance circuit, and is connected to the second terminal via at least the second capacitor of the second serial resonance circuit,
   wherein the filter device comprises a controller for controlling two attenuation pole frequencies of the filter device by changing a capacitance of the variable capacitive element,
   wherein the third capacitor is the variable capacitive element, and
   wherein one end of the variable capacitive element is connected to the first terminal via at least the first capacitor of the first serial resonance circuit, and the other end of the variable capacitive element is connected to the second terminal via at least the second capacitor of the second serial resonance circuit.

2. A filter device comprising a first terminal and a second terminal, the filter device comprising:
   a reactance element connected between the first terminal and the second terminal;
   a first serial resonance circuit connected between a connection point connecting the first terminal and one end of the reactance element, and a ground, the first serial resonance circuit including a first inductor and at least one first capacitor connected in series via respective connection points for connecting the first inductor and at least one first capacitor;
   a second serial resonance circuit connected between a connection point connecting the second terminal and the other end of the reactance element, and the ground, the second serial resonance circuit including a second inductor and at least one second capacitor connected in series via respective connection points for connecting the second inductor and at least one second capacitor; and a third capacitor connected between one of the respective connection points of the first serial resonance circuit and one of the respective connection points of the second serial resonance circuit, wherein one of the first, second, and third capacitors is a variable capacitive element, wherein the variable capacitive element is connected to the first terminal via at least the first capacitor of the first serial resonance circuit, and is connected to the second terminal via at least the second capacitor of the second serial resonance circuit, wherein the filter device comprises a controller for controlling two attenuation pole frequencies of the filter device by changing a capacitance of the variable capacitive element, wherein the third capacitor is the variable capacitive element, wherein one end of the variable capacitive element is connected to the first terminal via at least the first capacitor of the first serial resonance circuit, and is grounded via at least the first inductor of the first serial resonance circuit, and wherein the other end of the variable capacitive element is connected to the second terminal via at least the second capacitor of the second serial resonance circuit.

3. A filter device comprising a first terminal and a second terminal, the filter device comprising:

a reactance element connected between the first terminal and the second terminal;

a first serial resonance circuit connected between a connection point connecting the first terminal and one end of the reactance element, and a ground, the first serial resonance circuit including a first inductor and at least one first capacitor connected in series via respective connection points for connecting the first inductor and at least one first capacitor;

a second serial resonance circuit connected between a connection point connecting the second terminal and the other end of the reactance element, and the ground, the second serial resonance circuit including a second inductor and at least one second capacitor connected in series via respective connection points for connecting the second inductor and at least one second capacitor; and a third capacitor connected between one of the respective connection points of the first serial resonance circuit and one of the respective connection points of the second serial resonance circuit, wherein one of the first, second, and third capacitors is a variable capacitive element, wherein the variable capacitive element is connected to the first terminal via at least the first capacitor of the first serial resonance circuit, and is connected to the second terminal via at least the second capacitor of the second serial resonance circuit, wherein the filter device comprises a controller for controlling two attenuation pole frequencies of the filter device by changing a capacitance of the variable capacitive element, wherein the third capacitor is a serial connection circuit including a fourth capacitor and the variable capacitive element connected in series, wherein one end of the variable capacitive element is connected to the first terminal via at least the first capacitor of the first serial resonance circuit, and is grounded via at least the first inductor of the first serial resonance circuit, and wherein the other end of the variable capacitive element is connected to the second terminal via the fourth capacitor and at least the second capacitor of the second serial resonance circuit.

4. A filter device comprising a first terminal and a second terminal, the filter device comprising:

a reactance element connected between the first terminal and the second terminal;

a first serial resonance circuit connected between a connection point connecting the first terminal and one end of the reactance element, and a ground, the first serial resonance circuit including a first inductor and at least one first capacitor connected in series via respective connection points for connecting the first inductor and at least one first capacitor;

a second serial resonance circuit connected between a connection point connecting the second terminal and the other end of the reactance element, and the ground, the second serial resonance circuit including a second inductor and at least one second capacitor connected in series via respective connection points for connecting the second inductor and at least one second capacitor; and a third capacitor connected between one of the respective connection points of the first serial resonance circuit and one of the respective connection points of the second serial resonance circuit, wherein one of the first, second, and third capacitors is a variable capacitive element, wherein the variable capacitive element is connected to the first terminal via at least the first capacitor of the first serial resonance circuit, and is connected to the second terminal via at least the second capacitor of the second serial resonance circuit, wherein the filter device comprises a controller for controlling two attenuation pole frequencies of the filter device by changing a capacitance of the variable capacitive element, wherein the first serial resonance circuit includes a plurality of first capacitors, wherein one end of the first inductor is connected to the connection point connecting the first terminal and one end of the reactance element, and the plurality of the first capacitors are connected between the other end of the first inductor and ground, wherein one of the plurality of first capacitors is the variable capacitive element, wherein one end of the variable capacitive element is grounded, and wherein the other end of the variable capacitive element is connected to the first terminal via at least the first capacitor of the first serial resonance circuit, and is connected to the second terminal via the third capacitor and at least the second capacitor of the second serial resonance circuit.

5. The filter device as claimed in claim 4, wherein the other end of the variable capacitive element is further grounded via at least the second inductor of the second serial resonance circuit.

6. A filter device comprising a first terminal and a second terminal, the filter device comprising:

a reactance element connected between the first terminal and the second terminal;

a first serial resonance circuit connected between a connection point connecting the first terminal and one end of the reactance element, and a ground, the first serial resonance circuit including a first inductor and a first capacitor;
a second serial resonance circuit connected between a connection point connecting the second terminal and the other end of the reactance element, and the ground, the second serial resonance circuit including a second inductor and a second capacitor;
a variable capacitor element connected between a connection point connecting the first serial resonance circuit and the second serial resonance circuit, and the ground; and
a controller for controlling two attenuation pole frequencies of the filter device by changing a capacitance of the variable capacitive element.

7. A filter device comprising a first terminal and a second terminal, the filter device having a predetermined pass band, the filter device comprising:
a reactance element connected between the first terminal and the second terminal;
a first serial resonance circuit connected between a connection point connecting the first terminal and one end of the reactance element, and a ground, the first serial resonance circuit including a first capacitor having a first capacitance and a first inductor having a first inductance, and the first serial resonance circuit having a first resonance frequency determined based on a product of the first capacitance and the first inductance; and
a second serial resonance circuit connected between a connection point connecting the second terminal and the other end of the reactance element, and the ground, the second serial resonance circuit including a second capacitor having a second capacitance and a second inductor having a second inductance, and the second serial resonance circuit having a second resonance frequency determined based on a product of the second capacitance and the second inductance,
wherein the first and second resonance frequencies are set so that the first resonance frequency is closer to the pass band than the second resonance frequency, and so that a value obtained by dividing the first inductance by the first capacitance is larger than a value obtained by dividing the second inductance by the second capacitance.

8. The filter device as claimed in claim 7,
wherein at least one of the first capacitor and the second capacitor is a serial connection circuit including a third capacitor and a variable capacitive element connected in series.

9. A wireless communication device comprising:
a filter device for filtering a wireless received signal received by an antenna;
an amplifier for amplifying and outputting the wireless received signal from the filter device; and
a decoder for decoding a signal from the amplifier into a baseband signal, and outputting the baseband signal,
wherein the filter device comprises:
a first terminal;
a second terminal;
a reactance element connected between the first terminal and the second terminal;
a first serial resonance circuit connected between a connection point connecting the first terminal and one end of the reactance element, and a ground, the first serial resonance circuit including a first inductor and a first capacitor;
a second serial resonance circuit connected between a connection point connecting the second terminal and the other end of the reactance element, and the ground, the second serial resonance circuit including a second inductor and a second capacitor;
a variable capacitor element connected between a connection point connecting the first serial resonance circuit and the second serial resonance circuit, and the ground; and
a controller for controlling two attenuation pole frequencies of the filter device by changing a capacitance of the variable capacitive element.

10. A wireless communication device comprising:
a filter device for filtering a wireless received signal received by an antenna;
an amplifier for amplifying and outputting the wireless received signal from the filter device; and
a decoder for decoding a signal from the amplifier into a baseband signal, and outputting the baseband signal,
wherein the filter device has a predetermined pass band,
wherein the filter device comprises:
a first terminal;
a second terminal;
a reactance element connected between the first terminal and the second terminal;
a first serial resonance circuit connected between a connection point connecting the first terminal and one end of the reactance element, and a ground, the first serial resonance circuit including a first capacitor having a first capacitance and a first inductor having a first inductance, and the first serial resonance circuit having a first resonance frequency determined based on a product of the first capacitance and the first inductance; and
a second serial resonance circuit connected between a connection point connecting the second terminal and the other end of the reactance element, and the ground, the second serial resonance circuit including a second capacitor having a second capacitance and a second inductor having a second inductance, and the second serial resonance circuit having a second resonance frequency determined based on a product of the second capacitance and the second inductance,
wherein the first and second resonance frequencies are set so that the first resonance frequency is closer to the pass band than the second resonance frequency, and so that a value obtained by dividing the first inductance by the first capacitance is larger than a value obtained by dividing the second inductance by the second capacitance.

11. A wireless communication device comprising:
a filter device for filtering a wireless received signal received by an antenna;
an amplifier for amplifying and outputting the wireless received signal from the filter device; and
a decoder for decoding a signal from the amplifier into a baseband signal, and outputting the baseband signal,
wherein the filter device comprises:
a first terminal;
a second terminal;
a reactance element connected between the first terminal and the second terminal;
a first serial resonance circuit connected between a connection point connecting the first terminal and one end of the reactance element, and a ground, the first serial resonance circuit including a first inductor and at least one first capacitor connected in series via respective connection points for connecting the first inductor and at least one first capacitor;

a second serial resonance circuit connected between a connection point connecting the second terminal and the other end of the reactance element, and the ground, the second serial resonance circuit including a second inductor and at least one second capacitor connected in series via respective connection points for connecting the second inductor and at least one second capacitor; and a third capacitor connected between one of the respective connection points of the first serial resonance circuit and one of the respective connection points of the second serial resonance circuit, wherein one of the first, second, and third capacitors is a variable capacitive element, wherein the variable capacitive element is connected to the first terminal via at least the first capacitor of the first serial resonance circuit, and is connected to the second terminal via at least the second capacitor of the second serial resonance circuit, wherein the filter device comprises a controller for controlling two attenuation pole frequencies of the filter device by changing a capacitance of the variable capacitive element, wherein the third capacitor is the variable capacitive element, and wherein one end of the variable capacitive element is connected to the first terminal via at least the first capacitor of the first serial resonance circuit, and the other end of the variable capacitive element is connected to the second terminal via at least the second capacitor of the second serial resonance circuit.

12. A wireless communication device comprising:

a filter device for filtering a wireless received signal received by an antenna;

an amplifier for amplifying and outputting the wireless received signal from the filter device; and a decoder for decoding a signal from the amplifier into a baseband signal, and outputting the baseband signal, wherein the filter device comprises:

a first terminal;

a second terminal;

a reactance element connected between the first terminal and the second terminal;

a first serial resonance circuit connected between a connection point connecting the first terminal and one end of the reactance element, and a ground, the first serial resonance circuit including a first inductor and at least one first capacitor connected in series via respective connection points for connecting the first inductor and at least one first capacitor;

a second serial resonance circuit connected between a connection point connecting the second terminal and the other end of the reactance element, and the ground, the second serial resonance circuit including a second inductor and at least one second capacitor connected in series via respective connection points for connecting the second inductor and at least one second capacitor; and a third capacitor connected between one of the respective connection points of the first serial resonance circuit and one of the respective connection points of the second serial resonance circuit, wherein one of the first, second, and third capacitors is a variable capacitive element, wherein the variable capacitive element is connected to the first terminal via at least the first capacitor of the first serial resonance circuit, and is connected to the second terminal via at least the second capacitor of the second serial resonance circuit, wherein the filter device comprises a controller for controlling two attenuation pole frequencies of the filter device by changing a capacitance of the variable capacitive element, wherein the third capacitor is the variable capacitive element, wherein one end of the variable capacitive element is connected to the first terminal via at least the first capacitor of the first serial resonance circuit, and is grounded via at least the first inductor of the first serial resonance circuit, and wherein the other end of the variable capacitive element is connected to the second terminal via at least the second capacitor of the second serial resonance circuit.

13. A wireless communication device comprising:

a filter device for filtering a wireless received signal received by an antenna;

an amplifier for amplifying and outputting the wireless received signal from the filter device; and a decoder for decoding a signal from the amplifier into a baseband signal, and outputting the baseband signal, wherein the filter device comprises:

a first terminal;

a second terminal;

a reactance element connected between the first terminal and the second terminal;

a first serial resonance circuit connected between a connection point connecting the first terminal and one end of the reactance element, and a ground, the first serial resonance circuit including a first inductor and at least one first capacitor connected in series via respective connection points for connecting the first inductor and at least one first capacitor;

a second serial resonance circuit connected between a connection point connecting the second terminal and the other end of the reactance element, and the ground, the second serial resonance circuit including a second inductor and at least one second capacitor connected in series via respective connection points for connecting the second inductor and at least one second capacitor; and a third capacitor connected between one of the respective connection points of the first serial resonance circuit and one of the respective connection points of the second serial resonance circuit, wherein one of the first, second, and third capacitors is a variable capacitive element, wherein the variable capacitive element is connected to the first terminal via at least the first capacitor of the first serial resonance circuit, and is connected to the second terminal via at least the second capacitor of the second serial resonance circuit, wherein the filter device comprises a controller for controlling two attenuation pole frequencies of the filter device by changing a capacitance of the variable capacitive element, wherein the third capacitor is a serial connection circuit including a fourth capacitor and the variable capacitive element connected in series, wherein one end of the variable capacitive element is connected to the first terminal via at least the first capacitor of the first serial resonance circuit, and is grounded via at least the first inductor of the first serial resonance circuit, and wherein the other end of the variable capacitive element is connected to the second terminal via the fourth capacitor and at least the second capacitor of the second serial resonance circuit.

14. A wireless communication device comprising:
a filter device for filtering a wireless received signal received by an antenna;
an amplifier for amplifying and outputting the wireless received signal from the filter device; and
a decoder for decoding a signal from the amplifier into a baseband signal, and outputting the baseband signal,
wherein the filter device comprises:
a first terminal;
a second terminal;
a reactance element connected between the first terminal and the second terminal;
a first serial resonance circuit connected between a connection point connecting the first terminal and one end of the reactance element, and a ground, the first serial resonance circuit including a first inductor and at least one first capacitor connected in series via respective connection points for connecting the first inductor and at least one first capacitor;
a second serial resonance circuit connected between a connection point connecting the second terminal and the other end of the reactance element, and the ground, the second serial resonance circuit including a second inductor and at least one second capacitor connected in series via respective connection points for connecting the second inductor and at least one second capacitor; and
a third capacitor connected between one of the respective connection points of the first serial resonance circuit and one of the respective connection points of the second serial resonance circuit,
wherein one of the first, second, and third capacitors is a variable capacitive element,
wherein the variable capacitive element is connected to the first terminal via at least the first capacitor of the first serial resonance circuit, and is connected to the second terminal via at least the second capacitor of the second serial resonance circuit,
wherein the filter device comprises a controller for controlling two attenuation pole frequencies of the filter device by changing a capacitance of the variable capacitive element, wherein one of the plurality of first capacitors is the variable capacitive element,
wherein one end of the variable capacitive element is grounded, and
wherein the other end of the variable capacitive element is connected to the first terminal via at least the first capacitor of the first serial resonance circuit, and is connected to the second terminal via the third capacitor and at least the second capacitor of the second serial resonance circuit.

15. The filter device as claimed in claim 14,
wherein the other end of the variable capacitive element is further grounded via at least the second inductor of the second serial resonance circuit.

* * * * *